(12) United States Patent
Kim et al.

(10) Patent No.: US 9,153,759 B2
(45) Date of Patent: *Oct. 6, 2015

(54) LIGHT EMITTING DIODE, MANUFACTURING METHOD THEREOF, LIGHT EMITTING DIODE MODULE, AND MANUFACTURING METHOD THEREOF

(71) Applicant: SAMSUNG ELECTRONICS CO., LTD., Suwon-si, Gyeonggi-do (KR)

(72) Inventors: Hak Hwan Kim, Suwon-si (KR); Min Jung Kim, Siheung-si (KR); Kyung Mi Moon, Suwon-si (KR); Jong Sup Song, Suwon-si (KR); Jae Sung You, Suwon-si (KR); Ill Heoung Choi, Hwaseong-si (KR); Cheol Jun Yoo, Cheonan-si (KR)

(73) Assignee: SAMSUNG ELECTRONICS CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/310,664

(22) Filed: Jun. 20, 2014

(65) Prior Publication Data

US 2014/0299906 A1 Oct. 9, 2014

Related U.S. Application Data

(63) Continuation of application No. 13/428,726, filed on Mar. 23, 2012, now Pat. No. 8,785,953.

(30) Foreign Application Priority Data

Mar. 25, 2011 (KR) .......................... 10-2011-0027021
Mar. 25, 2011 (KR) .......................... 10-2011-0027033
Oct. 12, 2011 (KR) .......................... 10-2011-0104223

(51) Int. Cl.
 *H01L 33/00* (2010.01)
 *H01L 33/62* (2010.01)
 *H01L 33/50* (2010.01)

(52) U.S. Cl.
 CPC .............. *H01L 33/62* (2013.01); *H01L 33/505* (2013.01); *H01L 2224/32245* (2013.01); *H01L 2224/48091* (2013.01); *H01L 2224/73265* (2013.01); *H01L 2933/0041* (2013.01)

(58) Field of Classification Search
 USPC ............................................................ 257/98
 See application file for complete search history.

(56) References Cited

U.S. PATENT DOCUMENTS 6,372,608 B1 4/2002 Shimoda et al.
6,645,830 B2 11/2003 Shimoda et al.
(Continued)

FOREIGN PATENT DOCUMENTS

JP  2003008065 A  1/2003
JP  2008135709 A  6/2008
(Continued)

OTHER PUBLICATIONS

Korean Notice of Allowance issued in Korean Application No. 10-2011-0104223 dated May 19, 2014.

*Primary Examiner* — Asok K Sarkar
(74) *Attorney, Agent, or Firm* — McDermott Will & Emery LLP

(57) ABSTRACT

A manufacturing method of a light emitting diode (LED) and a manufacturing method of an LED module are provided. The manufacturing method of the LED may include manufacturing a plurality of LED chips, manufacturing a phosphor pre-form including a plurality of mounting areas for mounting the plurality of LED chips, applying an adhesive inside the phosphor pre-form, mounting each of the plurality of LED chips in each of the plurality of mounting areas, and cutting the phosphor pre-form to which the plurality of LED chips are mounted, into units including individual LED chips.

18 Claims, 35 Drawing Sheets

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,785,953 B2 * | 7/2014 | Kim et al. ............ 257/98 |
| 2008/0101072 A1 | 5/2008 | Ohta et al. |
| 2009/0065790 A1 | 3/2009 | Chitnis et al. |
| 2010/0109025 A1 | 5/2010 | Bhat |
| 2011/0006329 A1 | 1/2011 | Fujita et al. |

FOREIGN PATENT DOCUMENTS

| | | |
|---|---|---|
| JP | 2008-166740 A | 7/2008 |
| KR | 10-2010-0021891 A | 2/2010 |

* cited by examiner

800

800

LIGHT EMITTING DIODE, MANUFACTURING METHOD THEREOF, LIGHT EMITTING DIODE MODULE, AND MANUFACTURING METHOD THEREOF

CROSS-REFERENCE TO RELATED APPLICATION

This application is a continuation of U.S. patent application Ser. No. 13/428,726, filed on Mar. 23, 2012, which claims the benefit of Korean Patent Applications No. 10-2011-0104223, filed on Oct. 12, 2011, No. 10-2011-0027021, filed on Mar. 25, 2011, and No. 10-2011-0027033, filed on Mar. 25, 2011, in the Korean Intellectual Property Office, the disclosures of which are incorporated herein by reference.

BACKGROUND

1. Field of the Invention

The present invention relates to a light emitting diode (LED) having uniform wavelength conversion characteristics, a manufacturing method of the LED, an LED module, and a manufacturing method of the LED module.

2. Description of the Related Art

A light emitting diode (LED) chip is a semiconductor device that converts electrical energy to optical energy. The LED chip includes a compound semiconductor generating light having a particular wavelength according to an energy band gap. Use of LEDs is expanding to a field of displays such as a mobile display and a computer monitor, a field of a back light unit (BLU) for a liquid crystal display (LCD), and even a field of lighting.

Generally, an LED is manufactured by applying a phosphor resin to an upper portion of an LED chip so that the LED may generate light having a desired wavelength. For example, a white LED having a convex hemispherical surface may be manufactured by dispensing the phosphor resin onto the upper portion of the LED chip.

According to another example, a mask may be placed on a substrate to expose at least one LED chip mounted on the substrate, and phosphor resin may be printed. Next, the mask may be removed, thereby manufacturing a white LED having a rectangular parallelepiped surface.

However, in the foregoing conventional methods, uniform white light may not be obtained since the phosphor resin is applied non-uniformly. When uniformity of the phosphor resin is extremely low, non-uniformity of color distribution may be so increased that the LED may be inapplicable to products. As a result, yield may be affected.

When the phosphor resin is applied by dispensing, the process is performed chip by chip. Therefore, productivity per unit time is considerably reduced. Furthermore, when printing of the phosphor resin is performed using the mask, the phosphor resin may be deformed as the mask is removed.

A structure that modularizes the LED package by mounting the LED package on a printed circuit board (PCB) may have a limit to miniaturization of an LED module, and may not decrease a price of the LED module due to a high error rate during at least two mounting processes. A luminance and a color of the LED package may have a deviation due to a deviation in a wavelength and a luminance of an LED, a manufacturing tolerance associated with handicrafts, such as a lead frame and the like, and a process tolerance associated with a phosphor coating process, a lens molding process, and the like.

To improve an optical uniformity of the LED module, such as the luminance and a color uniformity of the LED module as a resultant product, various LEDs having different luminance degrees and colors may be grouped by performing binning, and LEDs in different groups may be used together.

A phosphor layer forming method for forming a phosphor layer in the LED may coat a substrate with a phosphor before mounting of an LED chip on the substrate so that a white light is emitted at an LED chip level. Examples of such a method include an electrophoresis scheme, a spray scheme, a printing scheme, a molding scheme, a phosphor pre-form attaching scheme, and the like.

In a case of a vertical LED chip, a method of forming a phosphor layer on a chip that is already attached to a substrate may include attaching, using a conductive adhesive, an LED chip on the substrate including wiring, connecting an electrode with another electrode by wire bonding, coating a top side with a transparent adhesive, and attaching a phosphor pre-form to the top side. However, the foregoing method has a difficulty in manufacturing the LED chip providing a white light and has a limit to decrease of color dispersion in an LED package level.

A range of the color dispersion demanded by the market is decreasing and a decrease in the color dispersion may determine the competitiveness that is directly associated with a quality and a yield. Therefore, there is a desire for a method of obtaining a high yield to decrease the range of the color dispersion and to improve productivity and competitiveness.

SUMMARY

An aspect of the present invention provides a light emitting diode (LED) including a phosphor mold including a phosphor and a resin, and an LED chip inserted into the phosphor mold.

Another aspect of the present invention provides an LED, a manufacturing method of the LED, an LED module, and a manufacturing method of the LED module, achieving uniform wavelength conversion characteristics and low non-uniformity of color distribution by employing a phosphor pre-form.

Still another aspect of the present invention provides an LED, a manufacturing method of the LED, an LED module, and a manufacturing method of the LED module, increasing productivity per unit time by employing a phosphor pre-form.

Yet another aspect of the present invention provides an LED, a manufacturing method of the LED, an LED module, and a manufacturing method of the LED module, securing a bonding force of a phosphor pre-form and a wire bonding space, by forming a first bump and a second bump in a 2-step structure on an LED chip.

According to an aspect of the present invention, there is provided a manufacturing method of an LED including manufacturing a plurality of LED chips, manufacturing a phosphor pre-form including a plurality of mounting areas for mounting the plurality of LED chips, applying an adhesive inside the phosphor pre-form, mounting each of the plurality of LED chips in each of the plurality of mounting areas, and cutting the phosphor pre-form to which the plurality of LED chips are mounted, into units including individual LED chips.

According to another aspect of the present invention, there is provided an LED including a phosphor sheet including a mounting area and a plurality of supporters formed on a bottom surface of the mounting area, and an LED chip supported by the plurality of supporters by being bonded to an inside of the mounting area by a light emission surface.

According to another aspect of the present invention, there is provided a manufacturing method of an LED module, the manufacturing method including manufacturing a plurality of LED chips, manufacturing a phosphor pre-form including a plurality of mounting areas for mounting the plurality of LED chips, applying an adhesive inside the phosphor pre-form, mounting each of the plurality of LED chips in each of the plurality of mounting areas, cutting the phosphor pre-form to which the plurality of LED chips are mounted, into units including individual LED chips, and mounting the individual LED chips on a substrate.

According to another aspect of the present invention, there is provided an LED module including a substrate including a circuit pattern, a phosphor sheet including a mounting area and a plurality of supporters disposed on a bottom surface of the mounting area, an LED chip supported by the plurality of supporters by being bonded to an inside of the mounting area by a light emission surface, and mounted on the substrate along with the phosphor sheet, and a lens portion disposed on the phosphor sheet.

BRIEF DESCRIPTION OF THE DRAWINGS

These and/or other aspects, features, and advantages of the invention will become apparent and more readily appreciated from the following description of exemplary embodiments, taken in conjunction with the accompanying drawings of which.

DETAILED DESCRIPTION

Figure 1:
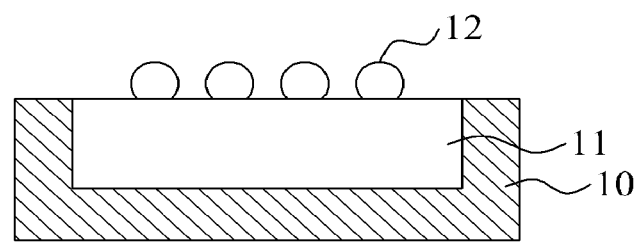
FIG. 1 is a diagram of a light emitting diode (LED) according to an embodiment of the present invention.

Reference will now be made in detail to exemplary embodiments of the present invention, examples of which are illustrated in the accompanying drawings, wherein like reference numerals refer to the like elements throughout. In the description of the present invention, if detailed descriptions of a related disclosed art or configurations are determined to unnecessarily make the subject matter of the present invention obscure, they will be omitted. Terms to be used below are defined based on their functions in the present invention and may vary according to users, user's intentions, or practices. Therefore, the definitions of the terms should be determined based on the entire specification.

FIG. 1 is a cross-sectional view of a light emitting diode (LED) according to an embodiment of the present invention. Referring to FIG. 1, the LED according to the embodiment of the present invention may include a phosphor mold 10 including a phosphor particle and a transparent resin and an LED chip 11 inserted into the phosphor mold 10. Also, electrode connection portions 12 may be formed on the LED chip 11. The electrode connection portions 12 may be bumps. Although FIG. 1 illustrates a flip-chip-type LED, embodiments of the present invention may be applied to any other types of LED.

The phosphor mold 10 may include a phosphor particle capable of receiving ultraviolet (UV) light or blue light emitted by the LED chip 11 and thereby emitting white light, and a transparent resin. The phosphor mold 10 may be obtained by mixing at least one phosphor particle with the transparent resin at an appropriate mixture ratio. The transparent resin may be a material having a high adhesive strength, a high heat resistance, a low hygroscopic property, a high light transmittance. For example, the transparent resin may be a polymer resin, an epoxy resin, or a silicon-based curable resin. Since the phosphor mold 10 may be formed by curing a phosphor particle and a transparent resin within a mold, the phosphor mold 10 may be a thermosetting resin. Here, the type and content of the phosphor particle are not limited and may be controlled according to optical properties of an LED and a package level. For example, the phosphor particle may contain a silicate, silicon trioxide, a salt of peroxophosphoric acid, an alkaline-earth oxide, or a rare-earth element at a content of approximately several to several tens of percents (%) by weight. Furthermore, additives, such as a hardener, an accelerator, and a mold release agent, may be added during manufacturing of the phosphor mold 10.

The phosphor mold 10 may include a cavity having such a shape and size as to mount the LED chip 11. For example, the phosphor mold 10 may be manufactured by an injection process using a mold to include a cavity into which the LED chip 11 may be inserted.

The shapes of the phosphor mold 10 and the cavity of the phosphor mold 10 may be varied by controlling the shape of the mold during the manufacturing of the phosphor mold 10. Although the phosphor mold 10 and the cavity C may have rectangular structures, the present invention is not limited thereto and the phosphor mold 10 and the cavity may have polygonal, circular, or oval structures. Also, although a corner portion of the phosphor mold 10 has an angled corner shape, the corner portion of the phosphor mold 10 may have a shape with a curvature. Furthermore, an uneven surface structure or a pattern may be formed in the top surface of the phosphor mold 10.

The LED chip 11 may be, for example, a semiconductor LED including a GaN-based semiconductor. However, the present invention is not limited thereto and the LED chip 11 may be any kind of LED chip, such as a flip-chip type or an epi-up type.

Hereinafter, a method of manufacturing an LED, according to an embodiment of the present invention, will be described with reference to the appended drawings.

Figure 2A:
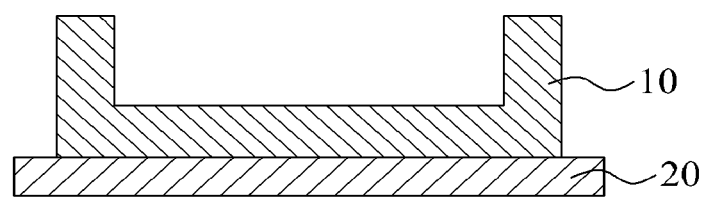
FIGS. 2A and 2B are diagrams illustrating a method of manufacturing an LED, according to an embodiment of the present invention.
Figure 2B:
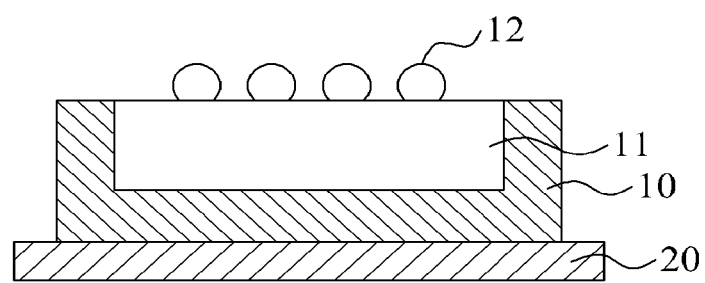

FIGS. 2A and 2B are diagrams illustrating a method of manufacturing an LED, according to an embodiment of the present invention.

Referring to FIG. 2A, the phosphor mold 10 including a phosphor particle and a transparent resin may be disposed on a base film 20. Referring to FIG. 2B, an LED chip 11 may be inserted into a cavity of the phosphor mold 10. In this state, the phosphor mold 10 may be incompletely cured or temporarily cured. That is, the phosphor mold 10 may be in a pre-form state. After the LED chip 11 is inserted into the cavity of the phosphor mold 10, the incompletely cured phosphor mold 10 may be cured and thereby bonded to the LED chip 11. Out of prefabricated LED chips, only the LED chips 11 meeting required performance may be selected and inserted into the cavity of the phosphor mold 10.

Besides the foregoing direct bonding method using a curing technique, the phosphor mold 10 and the LED chip 11 may be bonded to each other by adding an additional bonding material, as will be described with reference to FIGS. 3A through 3C.

Figure 3A:
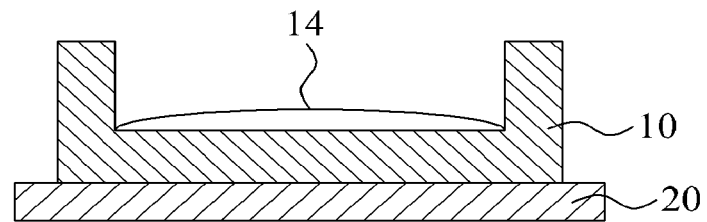
FIGS. 3A through 3C are diagrams illustrating a method of manufacturing an LED, according to another embodiment of the present invention.
Figure 3B:
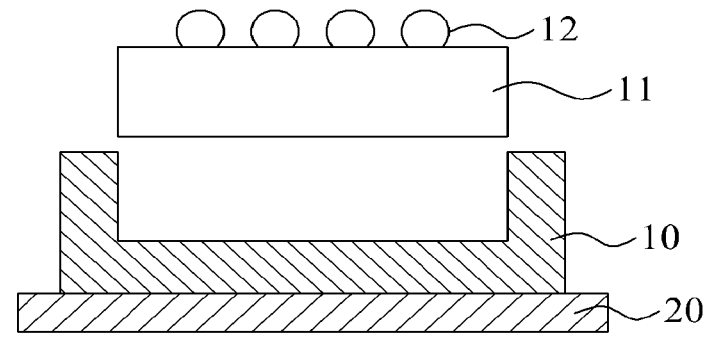
Figure 3C:
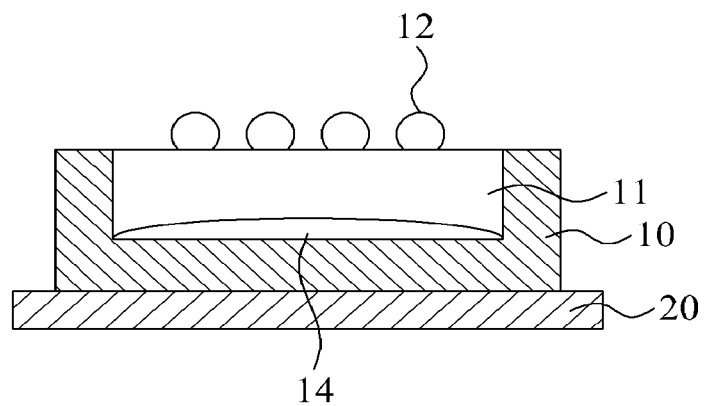

FIGS. 3A through 3C are diagrams illustrating a method of manufacturing an LED, according to another embodiment of the present invention.

Referring to FIG. 3A, a phosphor mold 10 including a phosphor particle and a transparent resin may be disposed on a base film 20, and a bonding material 14 may be inserted into a cavity of the phosphor mold 10. In this state, the phosphor mold 10 may be temporarily cured or completely cured.

Referring to FIGS. 3B and 3C, an LED chip 11 may be inserted into the cavity of the phosphor mold 10 and curing may be performed so that the LED chip 11 is bonded to the inside of the phosphor mold 10. Since the bonding material 14 is previously injected into the cavity of the phosphor mold 10, the LED chip 11 may be easily bonded to the inside of the cavity of the phosphor mold 10. Since the bonding material 14 is injected in advance in the cavity of the phosphor mold 10, the LED chip 11 may be easily bonded to the inside of the cavity.

Here, the bonding material 14 may be formed of a photosensitive adhesive (PSA), a single or composite material of polyolefin and a photopolymerized acryl resin, or a single or composite material of photopolymerized polyimide, epoxy based photopolymerized, and silicone-based photopolymerized material.

An LED according to an embodiment of the present invention may be produced as an array type in large quantities. The phosphor mold 10 may be manufactured as an array type by injection molding using a mold, as will be described with reference to FIGS. 4A through 4C.

Figure 4A:
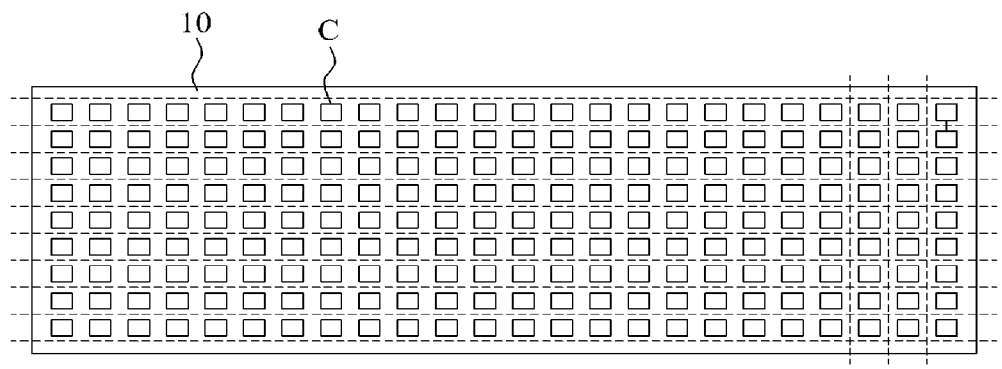
FIGS. 4A through 4C are diagrams illustrating a method of manufacturing an LED in an array type, according to an embodiment of the present invention.
Figure 4B:
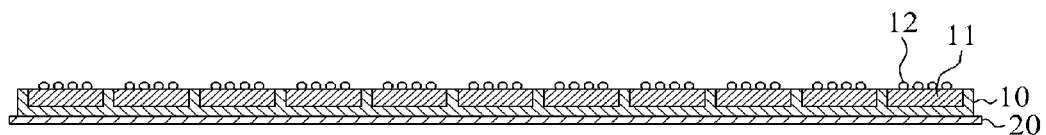
Figure 4C:
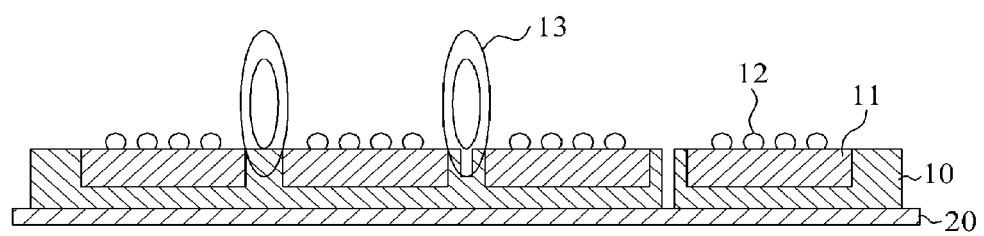

FIGS. 4A through 4C are diagrams illustrating a method of manufacturing an LED as an array type, according to an embodiment of the present invention.

FIG. 4A is a plan view of a phosphor mold 10 including an array of a plurality of cavities C. The number of cavities C formed in the phosphor mold 10 is not limited, and the depth and diameter of the cavities C may be determined according to the shape of the LED chip 11. An interval between the cavities C may be selected in consideration of a subsequent process of dicing the cavities C.

Although FIG. 4A illustrates that the phosphor mold 10 and the cavities C have rectangular shapes, the present invention is not limited thereto and the shapes of the phosphor mold 10 and the cavities may be variously modified. In addition to the rectangular structures, the phosphor mold 10 and the cavities C may have polygonal, circular, or oval structures. Also, an end portion of the phosphor mold 10 may have an angled corner shape or any other shape having a curvature. An uneven surface or a pattern may be formed in the surface of the phosphor mold 10 on which the LED chip 11 is mounted.

FIG. 4B is a sectional view illustrating a bonding structure obtained by inserting LED chips 11 into the respective cavities C of the array-type phosphor mold 10. As shown in FIG. 4B, the manufacturing of the LED according to the embodiment of the present invention may include manufacturing the phosphor mold 10 to include a phosphor particle and a transparent resin and bonding the LED chips 11 with the phosphor mold 10 by inserting the LED chips 11 into the cavities C of the phosphor mold 10, respectively.

FIG. 4C is a diagram illustrating a process of dicing the array-type LED shown in FIG. 4B. To increase the manufacturing efficiency, LEDs may be produced in an array type in large quantities and diced into individual packages using a cutting member 13 as necessary.

Although only a flip-chip package in which the electrode connection portions 12 are formed on the top surface of the LED chip 11 is illustrated, an LED according to an embodiment of the present invention may adopt LED chips 11 having various other shapes. To this end, the phosphor mold 10 may include a through hole through which an electrode connection portion is formed.

Figure 5:
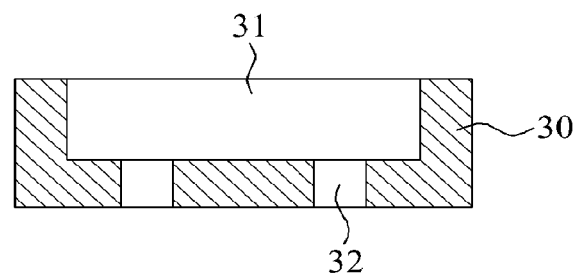
FIG. 5 is a diagram of a phosphor mold including a through hole in an LED according to an embodiment of the present invention.

FIG. 5 is a diagram illustrating an LED according to an embodiment of the present invention, in which a phosphor mold 30 includes a through hole 32.

Referring to FIG. 5, a phosphor mold 30 may be prepared, and an LED chip 31 may be formed in a cavity of the phosphor mold 30. The through hole 32 may be formed at a lower part of the LED chip 31 through the phosphor mold 30. The through hole 32, as an electrode connection portion, may be connected through a lateral surface of the LED chip 31. To this end, positions of the through holes 32 may be controlled during formation of the phosphor mold 30.

Figure 6:
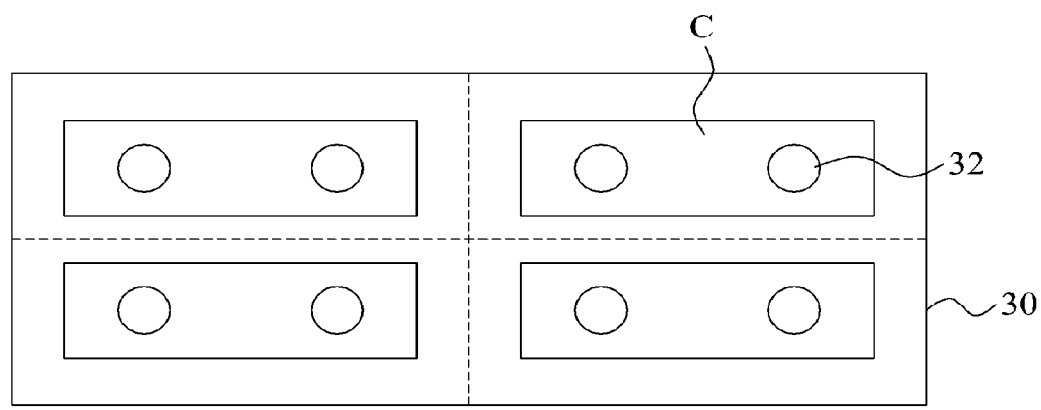
FIG. 6 is a plan view of a phosphor mold of the LED shown in FIG. 5.

FIG. 6 is a plan view of the phosphor mold 30 of the LED package of FIG. 5. Referring to FIG. 6, the phosphor mold 30 may include an array of cavities C to manufacture a plurality of LED packages. The through holes 32 used for forming the electrode connection portions may be formed in each of the cavities C.

The phosphor mold 30 and their cavities C may be variously modified in shapes, by controlling the shape of a mold during the formation of the phosphor mold 30. Although FIG. 6 illustrates that the phosphor mold 30 and the cavities C have rectangular structures, the present invention is not limited thereto and the phosphor mold 30 and the cavities C may have polygonal, circular, or oval structures. Furthermore, a corner portion of the phosphor mold 30 may have an angled corner shape or a shape with a curvature. An uneven surface or a pattern may be formed in the surface of the phosphor mold 30.

Figure 7:
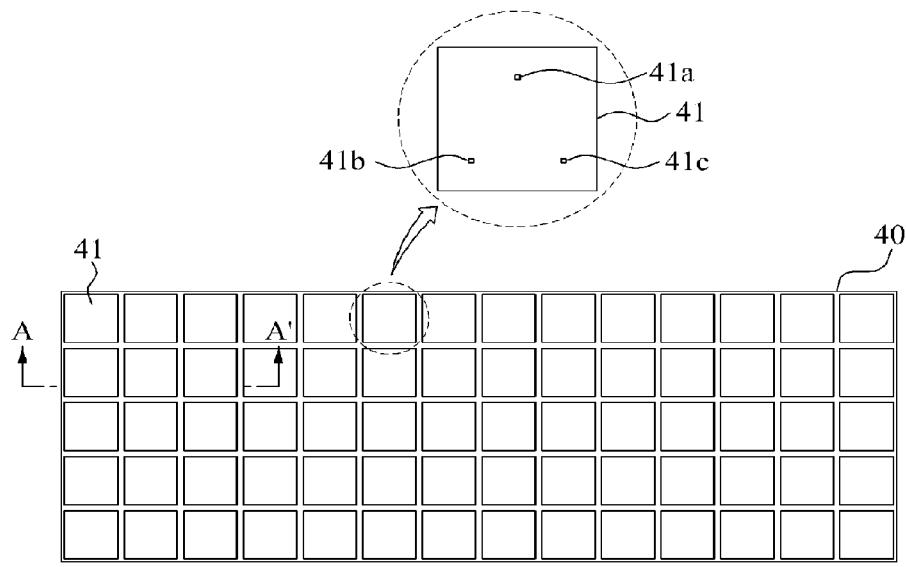
FIGS. 7 and 8 are diagrams illustrating a phosphor pre-form according to an embodiment of the present invention.
Figure 8:
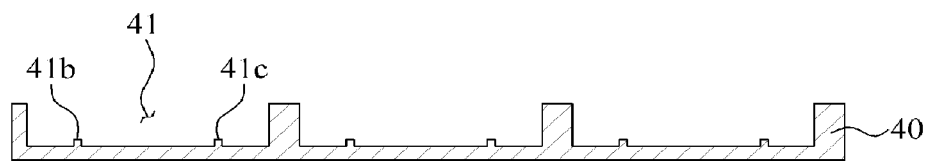

FIGS. 7 and 8 illustrate a phosphor pre-form 40 according to an embodiment of the present invention. To be specific, FIG. 7 is a plan view of the phosphor pre-form 40 seen from above and FIG. 2 is a sectional view of the phosphor pre-form 40 cut along a line A-A' shown in FIG. 7.

Referring to FIGS. 7 and 8, the phosphor pre-form 40 may include a plurality of mounting areas 41 for mounting light emitting diode (LED) chips. The plurality of mounting areas 41 may each include a recess capable of receiving an LED chip up to a lateral surface.

A first supporter 41a, a second supporter 41b, and a third supporter 41c may be disposed on a bottom surface of each of the plurality of mounting areas 41.

The first supporter 41a, the second supporter 41b, and the third supporter 41c may indicate a proper thickness of an adhesive to be applied in each mounting area 41 while supporting the LED chip to be mounted in each mounting area 41. The first supporter 41a, the second supporter 41b, and the third supporter 41c may be disposed, in balance, so as to support the LED chip.

As shown in FIG. 8, the first supporter 41a, the second supporter 41b, and the third supporter 41c may protrude from the bottom surface of each mounting area 41. Since the proper thickness of the adhesive may be recognized through the protruding structure, application of the adhesive may be facilitated. Also, deterioration of optical characteristics and generation of defective LEDs caused by overflowing adhesive may be prevented.

Figure 9A:
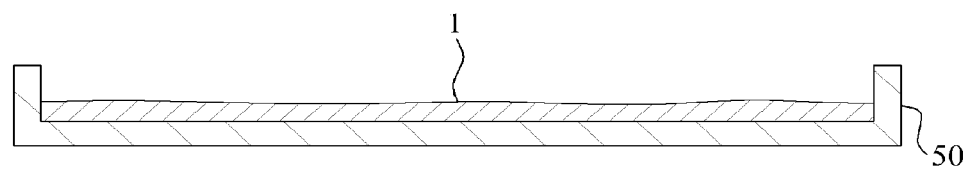
FIGS. 9A and 9B are diagrams illustrating a process of manufacturing the phosphor pre-form according to another embodiment of the present invention.
Figure 9B:
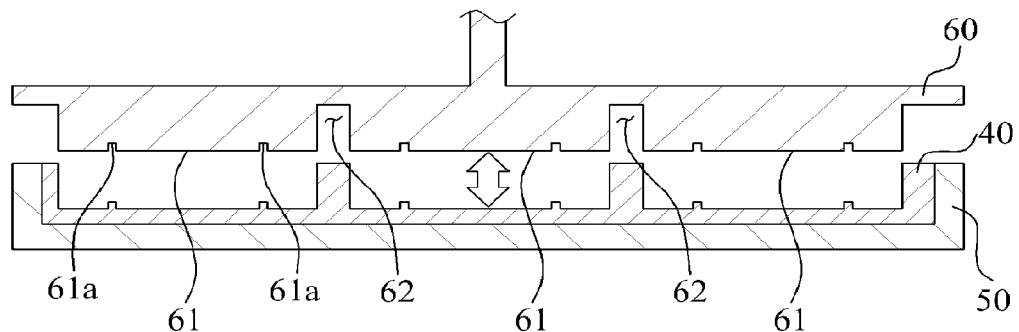

FIGS. 9A and 9B illustrate a process of manufacturing the phosphor pre-form 40 shown in FIGS. 7 and 8.

A manufacturing method of the phosphor pre-form 40 shown in FIGS. 7 and 8 may include manufacturing a phosphor resin 1 by mixing phosphor particles with a transparent resin, and injecting the phosphor resin 1 in a first mold 50.

The first mold 50 may include a receiving portion having a rectangular shape corresponding to an appearance of the phosphor pre-form 40. The phosphor resin 1 may be injected in the receiving portion.

Next, as shown in FIG. 9B, the manufacturing method of the phosphor pre-form 40 may include pressurizing the phosphor resin 1 by a first mold 60.

To be specific, the first mold 60 may have a size to be received in the receiving portion of the first mold 50. That is, the first mold 60 has a shorter circumferential length than the first mold 50.

A pressurizing surface of the first mold 60 may have a structure corresponding to the phosphor pre-form 40. That is, the pressurizing surface may include a plurality of protruding portions 31 for forming a plurality of mounting areas 41, a plurality of first recesses 31a for forming a first supporter 41a, a second supporter 41b, and a third supporter 41c in each of the plurality of mounting areas 41, and a plurality of second recesses 32 for dividing the phosphor resin 1 in units of the mounting area.

When the first mold 60 is received in the first mold 50 and the pressurizing surface pressurizes the phosphor resin 1, the phosphor resin 1 may be moved to a space between the first mold 50 and the first mold 60. Incomplete curing of the phosphor resin 1 may be performed in this state.

After the phosphor resin 1 injected in the first mold 50 is pressurized by the first mold 60 as shown in FIG. 9B, the first mold 50 and the first mold 60 are removed, thereby manufacturing the phosphor pre-form 40 shown in FIGS. 7 and 8.

Figure 10A:
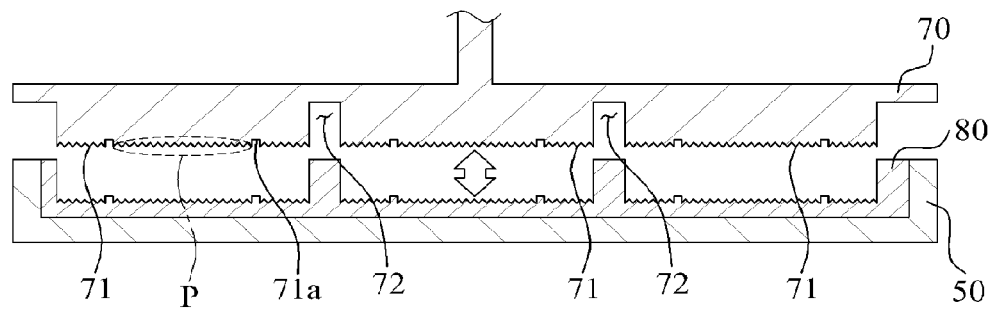
FIGS. 10A and 10B are diagrams illustrating a process of manufacturing a phosphor pre-form according to another embodiment of the present invention.
Figure 10B:
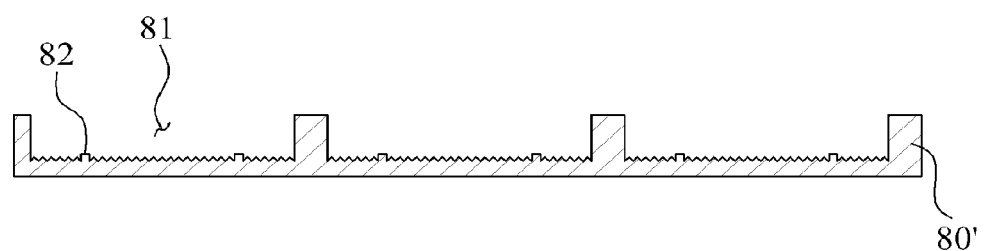

FIGS. 10A and 10B illustrate a process of manufacturing a phosphor pre-form according to another embodiment of the present invention.

Referring to FIG. 10A, a manufacturing method of a phosphor pre-form may include pressurizing a phosphor resin 80 injected in a first mold 50 by a second mold 70. The phosphor resin being pressurized by the second mold 70 may be partially cured, thereby manufacturing a phosphor pre-form 80.

A pressurizing surface of the second mold 70 may include a plurality of protruding portions 71, a plurality of first recesses 71a, and a plurality of second recesses 72.

However, the protruding portions 71 of the second mold 70 may include an uneven surface pattern P. Therefore, when the phosphor pre-form 80 is manufactured using the second mold 70 shown in FIG. 10A, the uneven surface pattern P may be transferred directly to the phosphor pre-form 80.

Next, by removing the first mold 50 and the second mold 70 from a phosphor sheet 80', a phosphor pre-form 200' as shown in FIG. 10B may be obtained. The phosphor pre-form 80' may include a plurality of mounting areas 81, and a plurality of supporters 82 disposed on a bottom surface of each of the plurality of mounting areas 81. In addition, bottom surfaces of the plurality of mounting areas 81 may each include an uneven surface pattern.

Figure 11A:
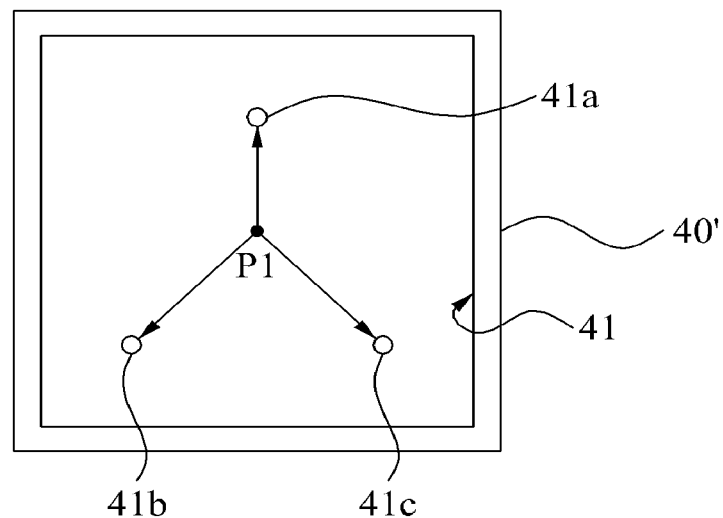
FIGS. 11A and 11B are diagrams illustrating various configurations of a supporter included in a phosphor pre-form, according to an embodiment of the present invention.
Figure 11B:
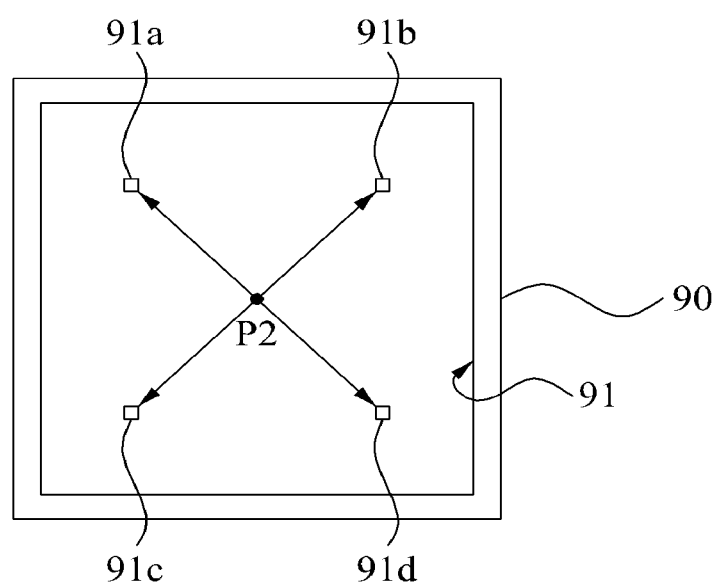

FIGS. 11A and 11B illustrate various configurations of supporters included in phosphor pre-forms 40' and 90, according to an embodiment of the present invention. Since the phosphor pre-forms 40' and 90 in FIGS. 11A and 11B are illustrated to explain the supporters, only a single mounting area 41 and 91 is shown in the phosphor pre-forms 40' and 90, respectively.

The phosphor pre-form 40' shown in FIG. 11A may be a unit phosphor pre-form cut into unit chips from the phosphor pre-form 40 of FIG. 7.

Referring to FIG. 11A, the phosphor pre-form 40' may include a mounting area 41 of an LED chip, a first supporter 41a, a second supporter 41b, and a third supporter 41c.

The first supporter 41a, the second supporter 41b, and the third supporter 41c may be disposed at predetermined distances from a central point P1 of a bottom surface of the mounting area 41. The first supporter 41a, the second supporter 41b, and the third supporter 41c may be arranged to form a triangle when connecting the first supporter 41a with the second supporter 41b, connecting the second supporter 41b with the third supporter 41c, and connecting the third supporter 41c with the first supporter 41a. In this case, the first supporter 41a, the second supporter 41b, and the third supporter 41c may be vertices of the triangle.

Although the first supporter 41a, the second supporter 41b, and the third supporter 41c shown in FIGS. 1 and 7 may be shown to have a cylindrical shape, they are not limited thereto, and other shapes such as a rectangular pillar may be employed.

The first supporter 41a, the second supporter 41b, and the third supporter 41c may have a width or diameter, a length, and a height in units of micrometers (μm). For example, the diameter, the length, and the height of the first supporter 41a, the second supporter 41b, and the third supporter 41c may all be about 10 μm. However, dimensions are not specifically limited thereto, but instead may be varied according to the size of the mounting area 41 or a number of the supporters.

Referring to FIG. 11B, the phosphor pre-form 90 may include a mounting area 91 of an LED chip, a first supporter 91a, a second supporter 91b, a third supporter 91c, and a fourth supporter 91d.

The first supporter 91a to the fourth supporter 91d may be disposed at predetermined distances from a central point P2 of a bottom surface of the mounting area 310. The first supporter 91a to the fourth supporter 91d may be disposed adjacent to respective corners of the mounting area 91.

The first supporter 91a to the fourth supporter 91d may be arranged to be in an axial symmetric structure or a point symmetric structure with respect to the central point P2. When thus symmetrically arranged, the first supporter 91a to the fourth supporter 91d may support LED chips mounted in the mounting area 310 more stably. Also, the LED chips may be mounted at a uniform height.

In addition, the first supporter 91a to the fourth supporter 91d may be arranged to form a rectangle when connecting the first supporter 91a with the second supporter 91b, connecting the second supporter 91b with the third supporter 91c, connecting the third supporter 91c with the fourth supporter 91d, and connecting the fourth supporter 91d with the first supporter 91a.

The first supporter 91a to the fourth supporter 91d may have a width, a length, and a height in units of μm. The height may be varied according to a proper thickness of an adhesive to be applied to the mounting area 310.

FIGS. 12A to 12D illustrate a manufacturing method of an LED according to an embodiment of the present invention. For convenience of explanation, FIGS. 12A to 12D will be described with reference to the phosphor pre-form 40 shown in FIG. 8.

Figure 12A:
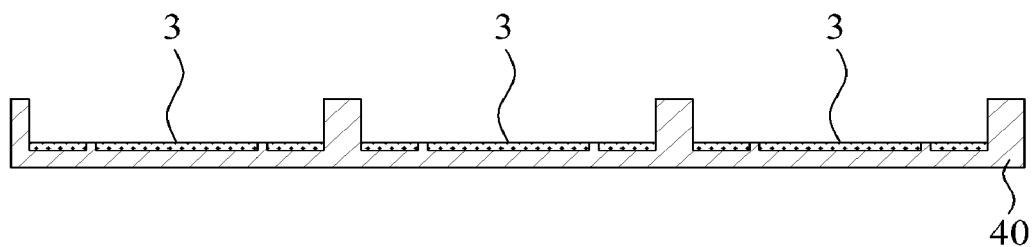
FIGS. 12A to 12D are diagrams illustrating a manufacturing method of an LED according to an embodiment of the present invention.

Referring to FIG. 12A, the manufacturing method of the LED may include applying an adhesive 400 inside the phosphor pre-form 40 prepared as shown in FIG. 2.

The adhesive 3 may be applied at a height not exceeding the height of the first supporter 41a, the second supporter 41b, and the third supporter 41c provided in the plurality of mounting areas 41. That is, only a proper amount of the adhesive 3 may be applied using the first supporter 41a to the third supporter 41c. Therefore, reduction in a bonding force caused by a lack of the adhesive 3 may be prevented. Also, deterioration of optical characteristics caused by an excessive thickness of the adhesive 3 may be prevented.

Figure 12B:
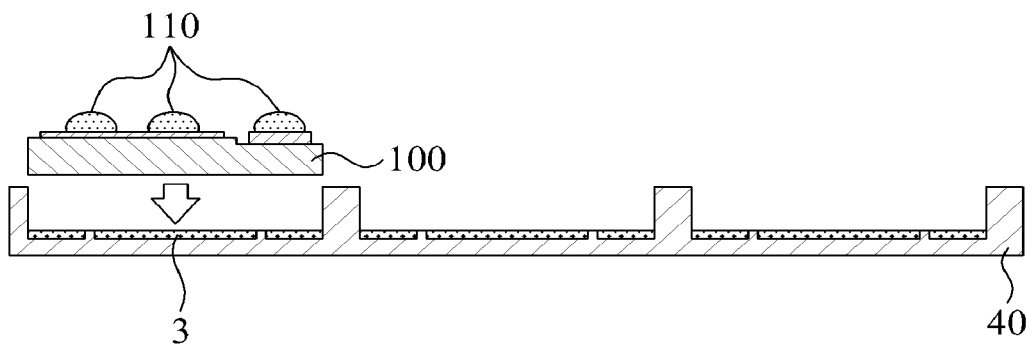

Referring to FIG. 12B, the manufacturing method of the LED may include mounting an LED chip 100 in each of the plurality of mounting areas 41. In the present embodiment, the LED chip 100 may include a light emission surface disposed on one surface, and a flip chip structure with an electrode disposed on another surface opposite to the light emission surface. The light emission surface of the LED chip 100 is mounted to each of the plurality of mounting areas 41. Here, a bump 110 may be formed in advance at the electrode of the LED chip 100.

Figure 12C:
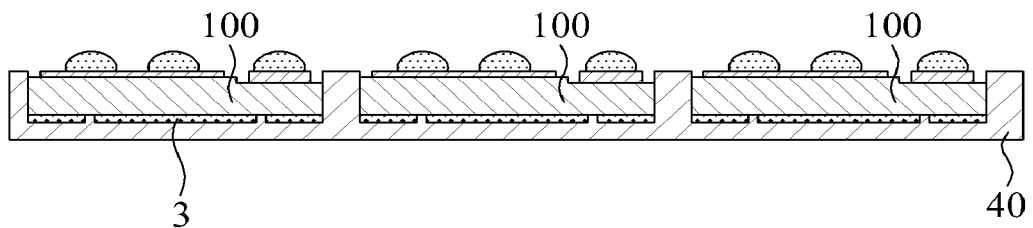

As shown in FIG. 12C, in a state in which the LED chip 100 is mounted in each of the plurality of mounting areas 41, the manufacturing method may include incomplete curing of the adhesive 3 to bond the LED chip 100 and the phosphor pre-form 40 to each other.

Figure 12D:
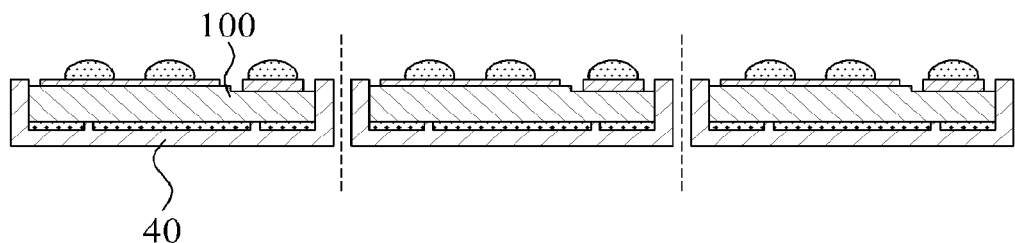

Referring to FIG. 12D, the manufacturing method may include cutting the phosphor pre-form 40 shown in FIG. 12C into units including individual LED chips. Each of the individual LED chips may be the LED chip 100 to which the unit phosphor pre-form 40' is attached.

Thus, since the unit phosphor pre-form 40' having a uniform thickness is used, the LED chip 100 may have uniform wavelength conversion characteristics throughout. The unit phosphor pre-form 40' may have a uniform thickness over the light emission surface and lateral surfaces of the LED chip 100. For example, the thickness may be about 5 μm or less. Accordingly, with regard to white light, the LED chip 100 including the unit phosphor pre-form 40' may have improved color reproduction characteristics. In addition, non-uniformity of color distribution may be reduced.

Furthermore, forming of the unit phosphor pre-form 40' with respect to the plurality of LED chips is performed through a large-area sheet level rather than in units of individual chip. Accordingly, productivity per unit time may be increased.

Also, cutting is performed after the LED chip 100 is mounted to the phosphor pre-form 40. Therefore, a shape and alignment of the LED chip 100 and the unit phosphor pre-form 40' may be improved.

Figure 13:
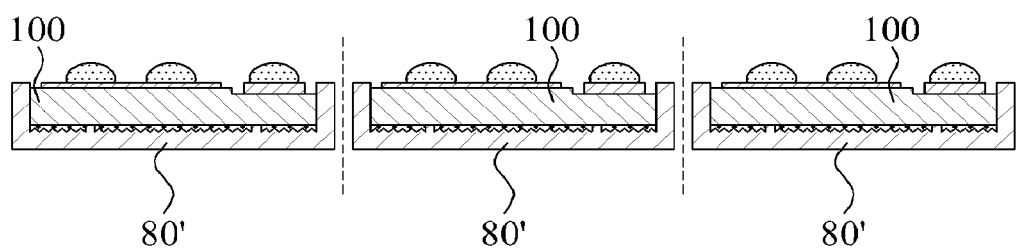
FIG. 13 is a diagram illustrating an LED manufactured by a manufacturing method according to another embodiment of the present invention.

FIG. 13 is a diagram illustrating an LED manufactured by a manufacturing method according to another embodiment of the present invention.

The LED may be manufactured by mounting a plurality of LED chips 100 on the phosphor pre-form 80' including the uneven surface pattern P as shown in FIG. 10B and then cutting the phosphor pre-form 80' into units including individual LED chips. Each of the individual LED chips may be the LED chip 100 to which the phosphor pre-form 200' is attached.

With reference to FIGS. 12D and 13, an example has been described in which the light emission surface of the LED chip 100 having a flip chip structure is bonded to the phosphor pre-forms 40 and 80, respectively. However, the LED chip may be structured in other manners.

Figure 14A:
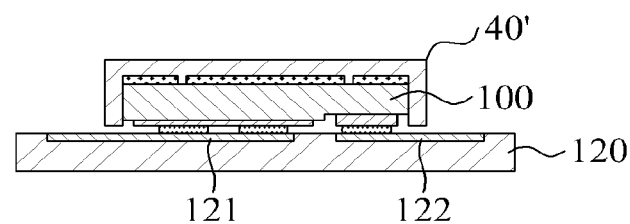
FIGS. 14A and 14B are diagrams illustrating a manufacturing method of an LED module according to an embodiment of the present invention.
Figure 14B:
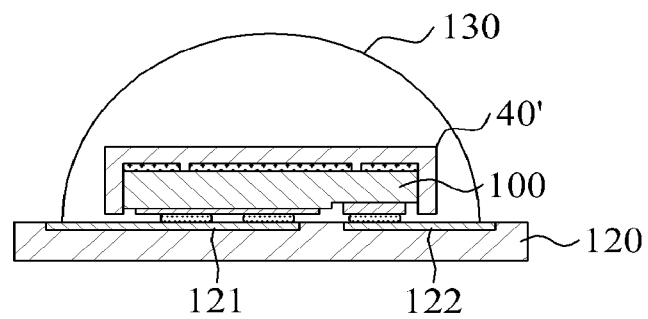

FIGS. 14A and 14B illustrate a manufacturing method of an LED module according to an embodiment of the present invention.

Referring to FIG. 14A, the manufacturing method of the LED module may include flip-chip bonding of an LED manufactured by the method illustrated in FIGS. 12A to 12D on a substrate 120. The substrate 120 may include a first circuit pattern 121 and a second circuit pattern 122 connected to an external circuit or external power source. Therefore, the LED may be flip-chip bonded on the substrate 120 such that the electrode provided to the LED chip 100 faces the first circuit pattern 121 and the second circuit pattern 122.

The light emission surface of the LED chip 100 may be attached with the unit phosphor pre-form 40'.

Next, as shown in FIG. 14B, a lens portion 130 may be formed by applying transparent resin to an upper portion of the LED chip 100 and the unit phosphor pre-form 40'.

Figure 15A:
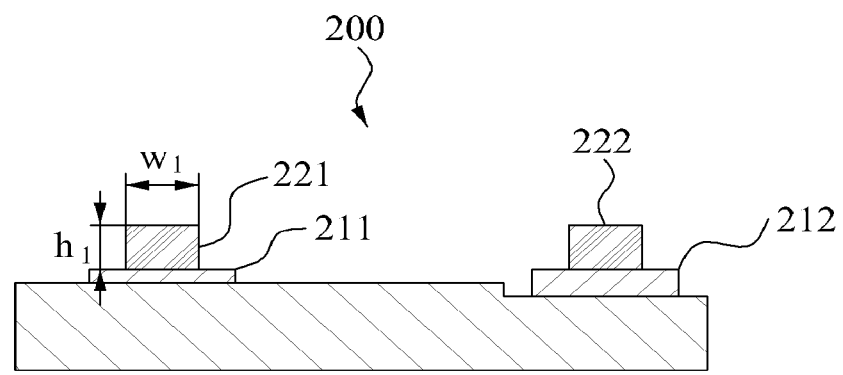
FIGS. 15A to 15F are diagrams illustrating a manufacturing method of an LED according to another embodiment of the present invention.

FIGS. 15A to 15F illustrate a manufacturing method of an LED according to still another embodiment of the present invention FIG. 15A illustrates a manufacturing process of a one-chip LED.

Referring to FIG. 15A, an LED chip 200 has a vertical structure and includes a first electrode 211 and a second electrode 212 disposed on one surface which includes a light emission surface. According to the manufacturing method of the present embodiment, first bumps 221 and 222 are formed on the first electrode 211 and the second electrode 212 of the LED chip 200. The first bumps 221 and 222 may be formed by plating a metallic material and may have a cylindrical shape.

The first bumps 221 and 222 may be formed in a first size. The first size may include at least one element selected from a first width $w_1$, a first length, and a first height $h_1$. According to the present embodiment, the first bumps 221 and 222 have a cylindrical shape of which the first width $w_1$ and the first length are equal.

Figure 15B:
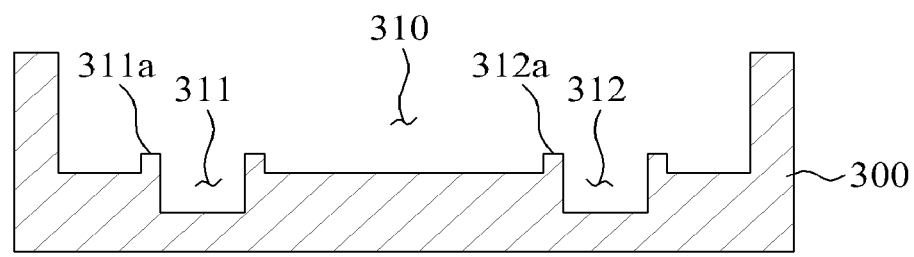

FIG. 15B illustrates a phosphor pre-form 700 according to another embodiment of the present invention.

The phosphor pre-form 40 shown in FIGS. 7 and 8 does not need to expose an electrode since an LED chip having a flip-chip structure is used. However, an LED chip having an epi-up structure or a vertical structure needs to expose an electrode since a surface including the electrode is bonded to a mounting area of a phosphor pre-form. Accordingly, FIG. 15B shows the phosphor pre-form 700 for mounting of the LED chip having the epi-up structure or the vertical structure.

The phosphor pre-form 300 may include a single mounting area 310 for mounting the LED chip 200 shown in FIG. 15A. However, this is only by way of example. Therefore, in actuality, the phosphor pre-form may include a plurality of mounting areas.

The phosphor pre-form 300 may include bump receiving portions 311 and 312 and supporters 311a and 312a disposed on a bottom surface of the mounting area 310.

The bump receiving portions 311 and 312 are adapted to receive the first bumps 221 and 222 of the LED chip 200. Therefore, the bump receiving portions 311 and 312 may have a cylindrical shape corresponding to the shape of the first bumps 221 and 222.

The bump receiving portions 311 and 312 may have a diameter greater than the first width $w_1$ of the first bumps 221 and 222 so as to smoothly receive the first bumps 221 and 222. Also, the bump receiving portions 311 and 312 may have a height slightly lower than the first height $h_1$ of the first bumps 221 and 222 so that the first bumps 221 and 222 protrude slightly.

The supporters 311a and 312a may be connected to the bump receiving portions 311 and 312 and protruded from the bottom surface of the mounting area 310. The supporters 311a and 312a may indicate a proper thickness of adhesive and accordingly prevent the adhesive from overflowing to the bump receiving portions 311 and 312.

The phosphor pre-form 300 shown in FIG. 15B may be manufactured in an aforementioned manner, that is, by pressurizing phosphor resin using a mold and incompletely curing the phosphor resin.

Figure 15C:
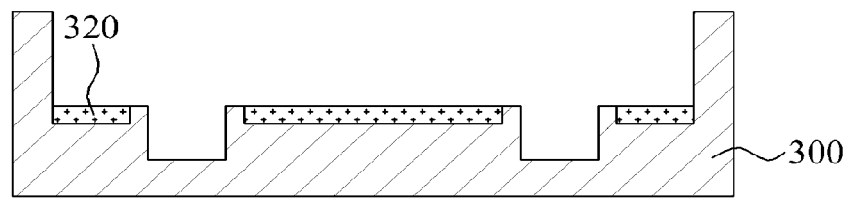

Referring to FIG. 15C, the manufacturing method of the LED may include applying an adhesive 320 in the mounting area 310 of the phosphor pre-form 300. The adhesive 320 may be applied so as not to exceed a height of the supporters 311a and 312a. In addition, the adhesive 320 may be applied only to the bottom surface of the mounting area 310, excluding the bump receiving portions 311 and 312.

Figure 15D:
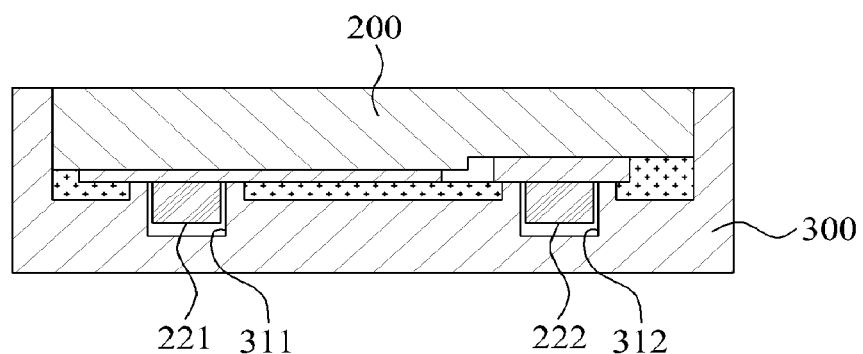

Referring to FIG. 15D, the manufacturing method of the LED may include mounting the LED chip 200 to the phosphor pre-form 300. As shown in FIG. 15A, the LED chip 200 may include the first electrode 211 and the second electrode 212 disposed on one surface, and the first bumps 221 and 222 disposed on the first electrode 211 and the second electrode 212. According to this structure, the LED chip 200 may be mounted in the mounting area 310 in a manner such that the first bumps 221 and 222 are received in the bump receiving portions 311 and 312.

After the LED chip 200 is mounted to the phosphor pre-form 300, the phosphor pre-form 300 may be fully cured, thereby manufacturing an LED. The fully cured pre-form 300, as a phosphor layer, may convert a wavelength of the light emitted from the LED chip 200.

Figure 15E:
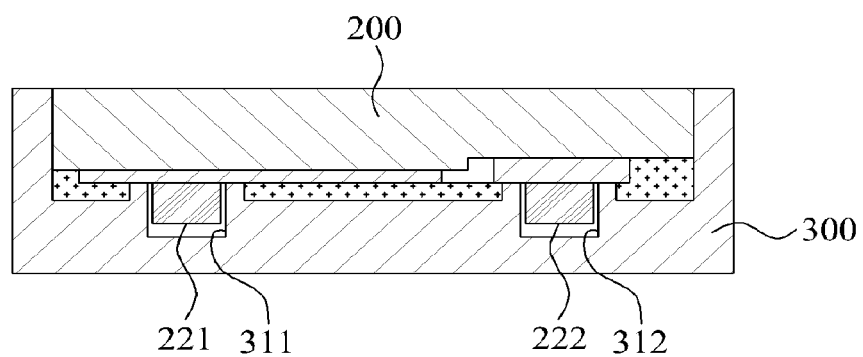

Referring to FIG. 15E the manufacturing method of the LED may include opening the bump receiving portions 311 and 312 by polishing one surface of the phosphor pre-form 300. The bump receiving portions 311 and 312 may be opened by the polishing, thereby exposing the first bumps 221 and 222. The polished phosphor pre-form 300 may have a thickness of about 5 μm or less.

Figure 15F:
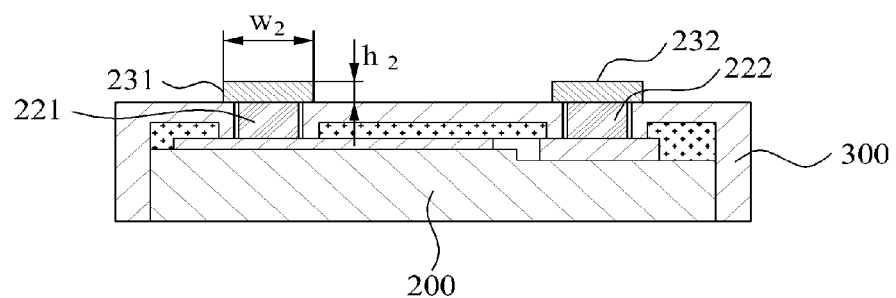

Referring to FIG. 15F, the manufacturing method of the LED may include forming second bumps 231 and 232 on the first bumps 221 and 222. The second bumps 231 and 232 may be disposed at an outer portion of the phosphor pre-form 300 within the bump receiving portions 311 and 312, so as to be bonded to the first bumps 221 and 222. In the present embodiment, the second bumps 231 and 232 may have a second size greater than the first size of the first bumps 221 and 222. The second size may include at least one element selected from a second width $w_2$, a second length, and a second height $h_2$.

The second bumps 231 and 232 may have a cylindrical shape similar to that of the first bumps 221 and 222. The second width $w_2$ may be greater than the first width $w_1$. Since the second bumps 231 and 232 have a wire bonding structure, the second width $w_2$ may be greater than a cross-sectional diameter of the wire. For example, when the cross-sectional diameter of the wire is 1.5 mil, the second width $w_2$ may be greater than 1.5 mil.

In addition, the second bumps 231 and 232 may have a width greater than the width of the bump receiving portions 311 and 312. Therefore, the second bumps 231 and 232 structured to cover the the bump receiving portions 311 and 312 at the outer portion of the phosphor pre-form 300 may fix the phosphor pre-form 300.

Figure 16A:
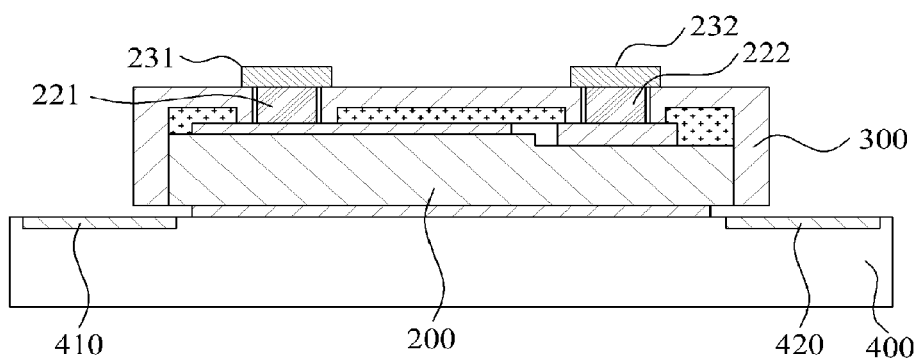
FIGS. 16A to 16B are diagrams illustrating a manufacturing method of an LED module according to still another embodiment of the present invention.
Figure 16B:
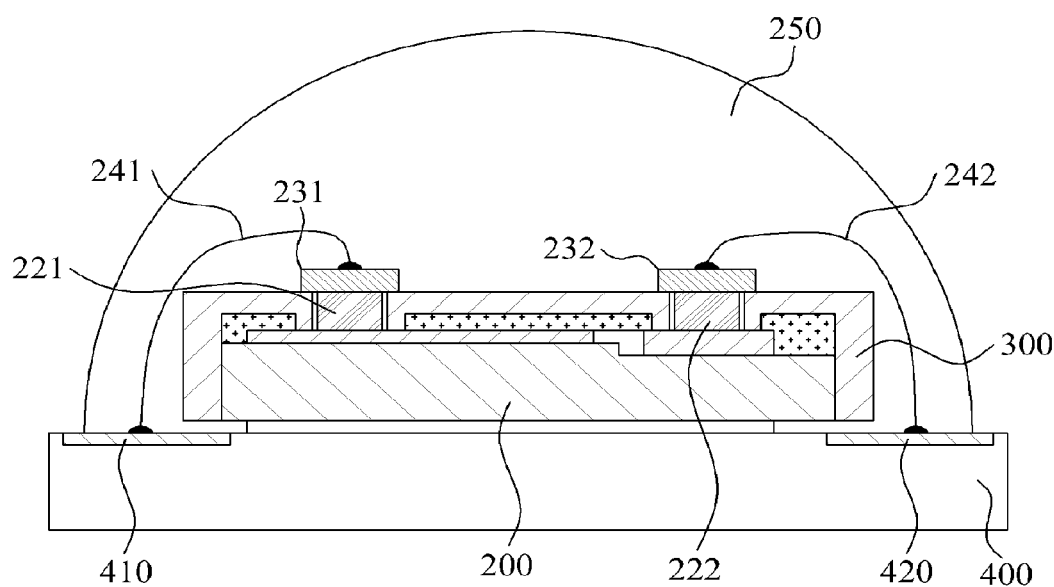

FIGS. 16A to 16B illustrate a manufacturing method of an LED module according to yet another embodiment of the present invention.

Referring to FIG. 16A, the manufacturing method of the LED may include bonding an LED manufactured by the method shown in FIGS. 15A to 15F on a substrate 400.

The substrate 400 may include a first circuit pattern 410 and a second circuit pattern 420 connected to an external circuit or external power source. After the bonding of the LED, wires 241 and 242 may be bonded to the first circuit pattern 410 and the second circuit pattern 420, and the two bumps 231 and 232 formed at the outer portion of the phosphor pre-form 300, as shown in FIG. 16B.

Next, as shown in FIG. 16B, transparent resin may be applied to an upper portion of the phosphor pre-form 700', thereby forming a lens portion 250.

In the LED shown in FIG. 16B, the phosphor pre-form 300 may be formed in a thickness of about 5 µm or less over the light emission surface and lateral surfaces of the LED chip 200. The phosphor pre-form 300 may increase color reproduction characteristics while reducing non-uniformity of color distribution.

In addition, since the phosphor pre-form 300 is fixed by the second bumps 231 and 232 disposed on the bump receiving portions 711 and 712, a bonding force with respect to the LED chip 200 may be increased.

Figure 17A:
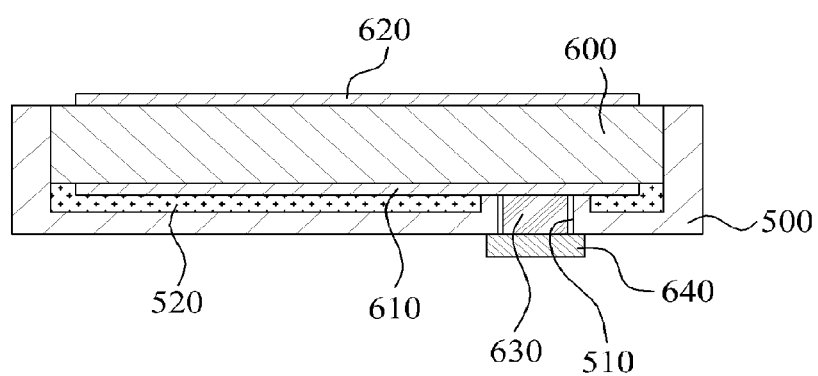
FIGS. 17A and 17B are diagrams illustrating a manufacturing method of an LED module according to yet another embodiment of the present invention.
Figure 17B:
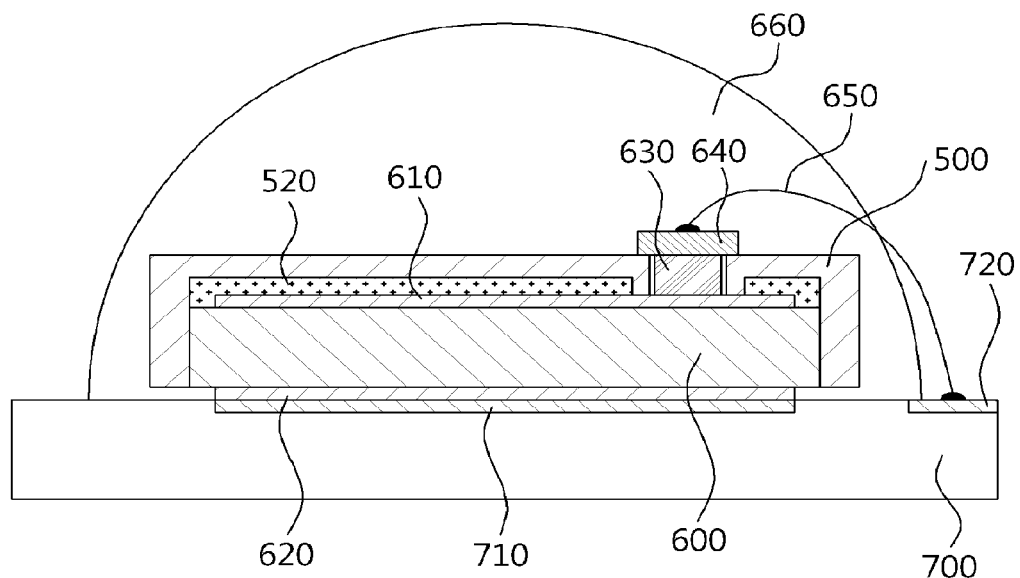

FIGS. 17A and 17B illustrate a manufacturing method of an LED module according to further another embodiment of the present invention.

FIG. 17A shows an LED including a phosphor pre-form 500 and an LED chip 600. The LED shown in FIG. 17A may be manufactured in a similar manner to the method shown in FIGS. 15A to 15F. However, the LED chip 600 according to the present embodiment may have a vertical structure in which a first electrode 610 is disposed on an upper surface while a second electrode 620 is disposed on a lower surface. The LED chip 600 may further include a first bump 630 disposed on the first electrode 610.

For mounting of the LED chip 600, the phosphor pre-form 500 may include a bump receiving portion 810 for receiving the first bump 630. The bump receiving portion 810 may have a size and shape corresponding to the first bump 630 so as to receive the first bump 630.

The phosphor pre-form 500 may be bonded to the LED chip 600 by adhesive 820 applied to an inside of the phosphor pre-form 500. A second bump 640 may be formed in a region including the bump receiving portion 510 at an outer portion of the phosphor pre-form 500. The second bump 640 has a size greater than the first bump 630 and the bump receiving portion 810. The second bump 640 may provide a wire bonding space while increasing a bonding force between the phosphor pre-form 500 and the LED chip 600.

Referring to FIG. 17B, the manufacturing method of the LED module may include mounting the LED shown in FIG. 17A on a substrate 700 and performing wire bonding.

The substrate 700 may include a first circuit pattern 710 and a second circuit pattern 720. The LED is mounted to the first circuit pattern 710 by bonding the second electrode 920 of the LED chip 600 to the first circuit pattern 710. In this state, a wire 950 is bonded to the second bump 940 exposed through the bump receiving portion 810 of the phosphor pre-form 500 and the second circuit pattern 720. Here, the second bump 940 may have a size greater than a cross section of the wire 950 and facilitate bonding of the wire 950.

Next, the manufacturing method of the LED module may include forming a lens portion 660 on an upper portion of the phosphor pre-form 500.

According to the foregoing embodiments, the phosphor pre-forms achieve uniform wavelength conversion and low non-uniformity of color distribution.

In addition, since a plurality of LED chips are mounted on a phosphor pre-form and the phosphor pre-form is cut into units including individual LED chips, productivity per unit time may be increased. Also, a shape and alignment of the LED chips and the phosphor pre-form may be improved.

Moreover, since a first bump and a second bump are formed in a 2-step structure on an LED chip, a bonding force of the phosphor pre-form may be increased and a wire bonding space may be secured.

A phosphor layer forming method according to an embodiment of the present invention may include preparing at least one LED chip having the same optical property, preparing a phosphor pre-form that corresponds to the at least one LED chip and that includes the phosphor layer and an adhesive layer, and bonding the phosphor pre-form and the at least one LED chip. Through the foregoing method, an LED having a wavelength conversion characteristics may be manufactured.

According to the embodiment of the present invention, the phosphor layer forming method for forming a phosphor layer on an LED chip may classify LED chips for each property to provide a white light. By performing binning, the LED chips are arranged for each group. Here, binning is a process of classifying and grouping the LED chips according to the same optical property. That is, the LED chips may be classified and arranged, in advance, according to the same optical property, to provide a white light. Therefore, an optical uniformity, such as a luminance of an LED module, a color uniformity, and the like may be improved.

According to the phosphor layer forming method for forming a phosphor layer on an LED chip, the phosphor pre-form may be classified into two types based on a shape. One is a film type applied to a structure that emits most light via a top of an LED chip, such as a flip chip or a vertical LED chip of which a growth substrate is removed. The other is a cavity type applied to a structure that emits light via a top and a side of the growth substrate since the growth substrate is not removed. The cavity phosphor pre-form will be described when bonding of the cavity type phosphor pre-form and an LED chip is described.

FIGS. 18A through 18F illustrate a structure of a film type phosphor pre-form 800 according to an embodiment.

Referring to FIGS. 18A through 18F, the structure of the film type phosphor pre-form 800 may be classified into four types. A type (a) of the film type phosphor pre-form 800 may include a carrier film 810, a photo sensitive adhesive (PSA) layer 820, a phosphor layer 830, an adhesive layer 840, and a cover film 850. The cover film 850 may protect the adhesive layer 840 and may be removed before processing. The adhesive layer 840 may help attach the phosphor layer 830 to a top of an LED chip. The PSA layer 820 may be a temporary adhesive layer that loses an adhesive property when an ultraviolet ray is irradiated so that the phosphor layer 830 is readily separated from the carrier film 810. The carrier film 810 may protect the PSA layer 820 and the phosphor layer 830 during transfer of the phosphor pre-form.

In a type (b) of the film type phosphor pre-form 800, the PSA layer 820 is removed from the type (a) of the film type phosphor pre-form 800. It is difficult to separate the phosphor layer 830 from the carrier film 810 in the film type phosphor pre-form 800 of the type (b), when compared to a film type phosphor pre-form including the PSA layer 820. However, when a size of an LED chip is small and adhesion of the phosphor layer 830 is adjustable, the PSA layer 820 may be readily removed.

In a type (c) of the film phosphor pre-form 800, the adhesive layer 840 is removed from the type (a) of the film phosphor pre-form 100. In the type (c) of the film phosphor pre-form 800, the adhesive layer 840 may be removed when adhesion of the phosphor layer 830 is sufficient to attach the film phosphor pre-form 800 to the LED chip or when a bonding process for the phosphor layer 830 is optimized by adjusting a curing level in the phosphor layer 830.

Figure 18A:
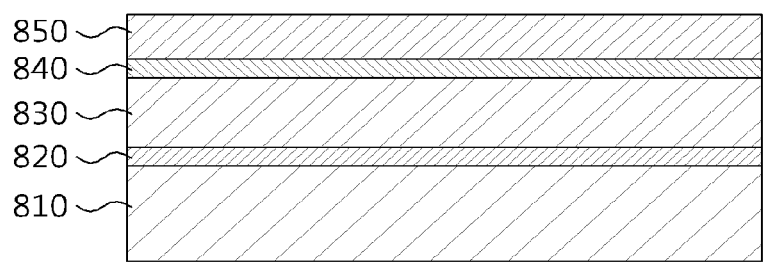
FIGS. 18A through 18F is a diagram illustrating a structure of a film type phosphor pre-form according to an embodiment of the present invention.
Figure 18B:
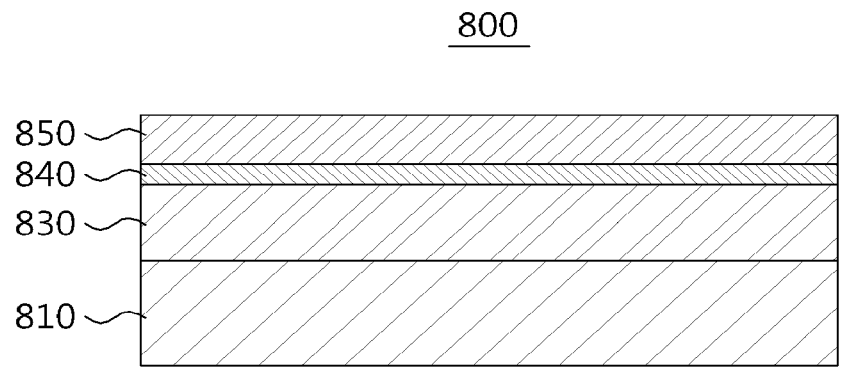
Figure 18C:
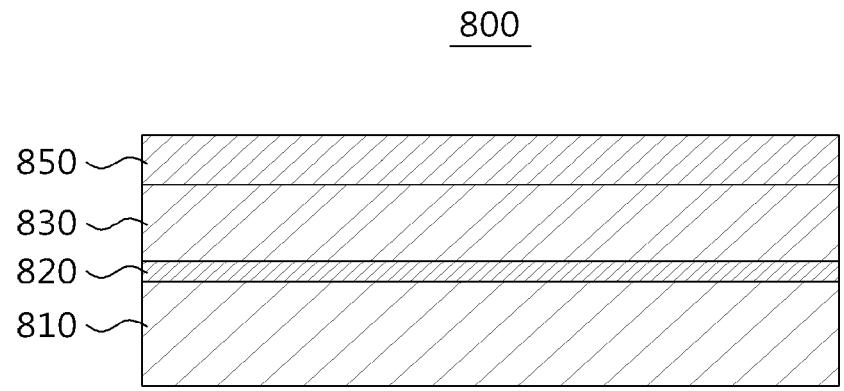
Figure 18D:
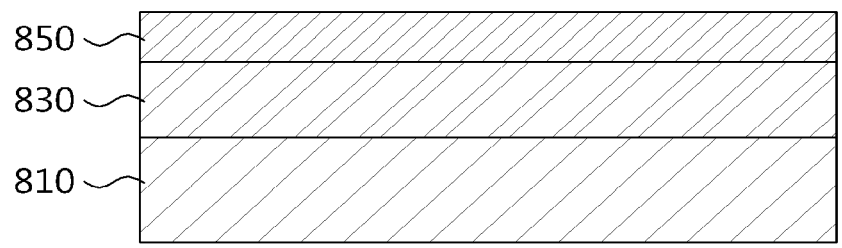
Figure 18E:
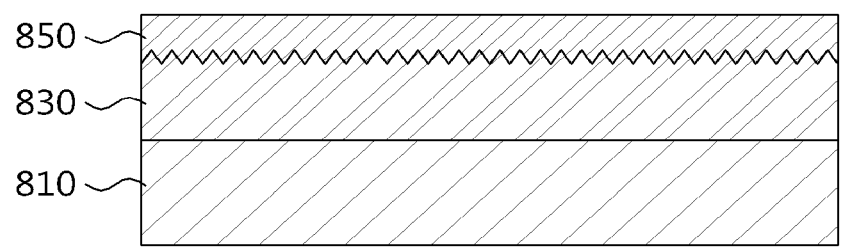
Figure 18F:
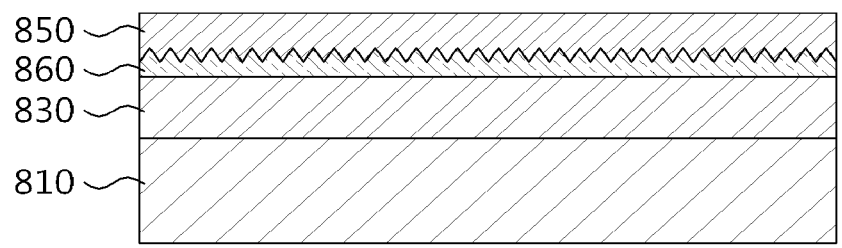

In a type (d) of the film phosphor pre-form 800, the PSA layer 820 and the adhesive layer 840 are removed from the type (a) of the film phosphor pre-form 800. The film type phosphor pre-form 800 of the type (d) may be effective in terms of cost since a number of layers decreases. In the type (d) of the film phosphor pre-form 800, the PSA layer 820 and the adhesive 840 may be removed when the phosphor layer 830 is designed to maintain optimal adhesion or when an element that controls the adhesion is added to an interface between the carrier film 810 and the phosphor layer 830. A refractive index of the adhesive layer 840 of the film phosphor pre-form 800 may be greater than or equal to a refractive index of the phosphor layer 830. Therefore, light extraction efficiency for light generated from in the LED chip may be maximized. Referring to FIG. 18E, a top of the phosphor layer 830 may be patterned into an uneven surface, to improve the light extraction efficiency. Referring to FIG. 18F, a protrusion 860 formed on the phosphor layer 830 may be further included.

The protrusion 860 may have a refractive index that is equal to the refractive index of the phosphor layer 830, and may be constituted by organic and inorganic polymers that are heat-resistant and transparent. The uneven surface formed on the phosphor layer 830 or an uneven surface formed on the protrusion 860 may be formed by slit die printing using a previously patterned cover film.

The adhesive layer 840 may be transparent so that the adhesive layer 840 emits light to an outside, and may include an epoxy resin or a silicon resin. High heat-conductive particles may be evenly dispersed in the adhesive layer 840 so that heat generated from the LED chip is effectively transmitted to the outside via the phosphor layer 830, and the particles may be nanoscale particles. The adhesive layer 840 may have a thickness in the range of about 40 µm to 60 µm, and the adhesive layer 840 having a thickness of about 50 µm may be desirable.

When an LED chip and a film type phosphor pre-form are prepared, the LED chip and the film type phosphor pre-form may be individually bonded. A plurality of LED chips and a plurality of film type phosphor pre-forms may be simultaneously bonded. When LED chips formed on a wafer are provided and a film type phosphor pre-form is provided in a sheet form, the LED chips and the phosphor pre-form may be simultaneously bonded. In this example, the LED chip and the phosphor pre-form may be arranged to correspond to each other before being bonded.

A process that bonds the LED chip and the film type phosphor pre-form will be described.

Figure 19:
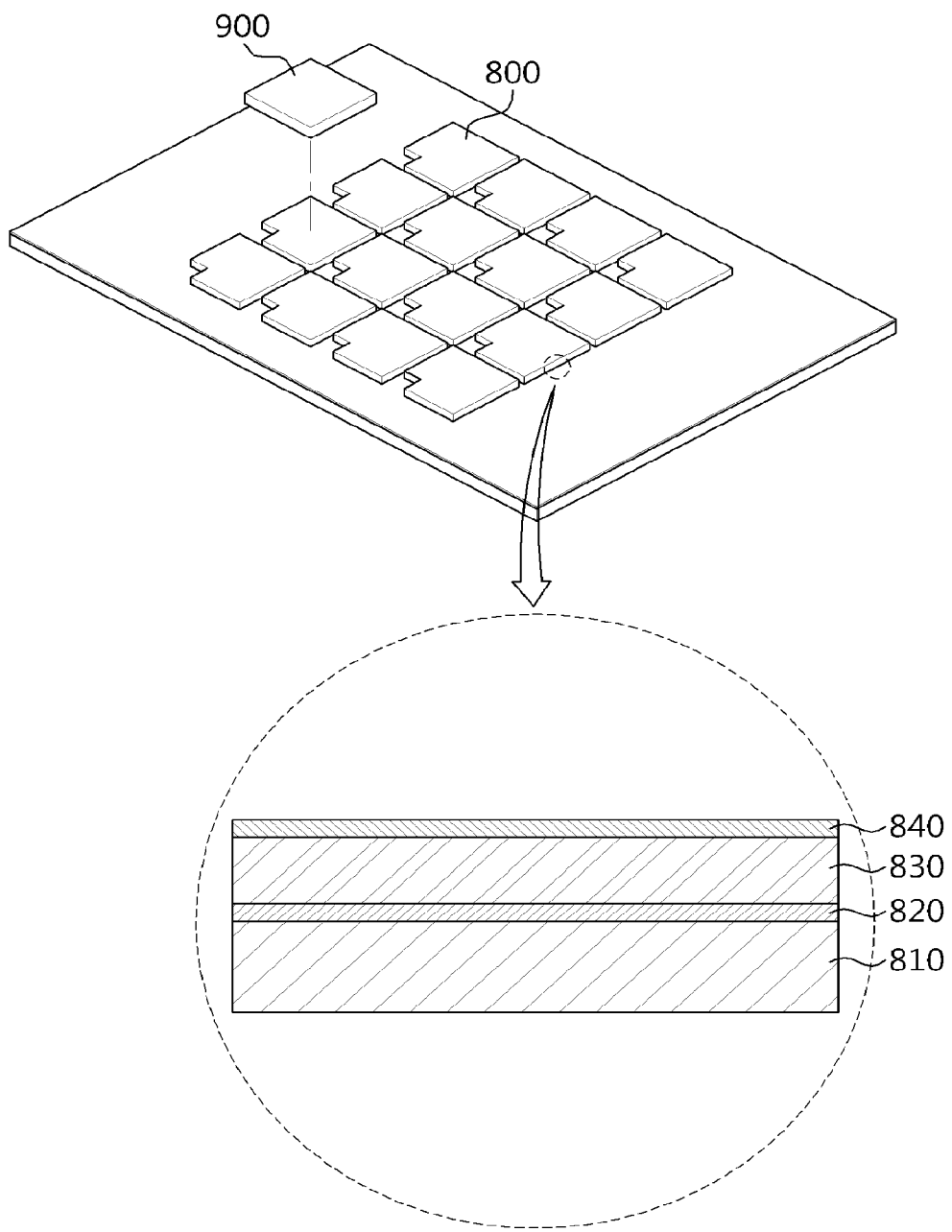
FIG. 19 is a diagram illustrating an example of bonding a film type phosphor pre-form and an LED chip according to an embodiment of the present invention.

FIG. 19 illustrates an example of bonding the film type phosphor pre-form 800 and an LED chip 900 according to example embodiments.

Referring to FIG. 19, various film type phosphor pre-forms 800 are separately arranged. The adhesive layer 840 may be included at the top of the film type phosphor pre-form 800 so that the LED chip 900 may be attached to the film type phosphor pre-form 800. Here, the film type phosphor pre-form 800 and the LED chip 900 are individually bonded.

The LED chips 200 are separately arranged. In this example, the film type phosphor pre-form 800 may be individually bonded to the LED chip 900, using an adhesive layer.

Depending on embodiments, a phosphor layer forming apparatus that forms a phosphor layer in an LED chip may simultaneously bond a plurality of film type phosphor pre-forms to a plurality of LED chips.

Figure 20A:
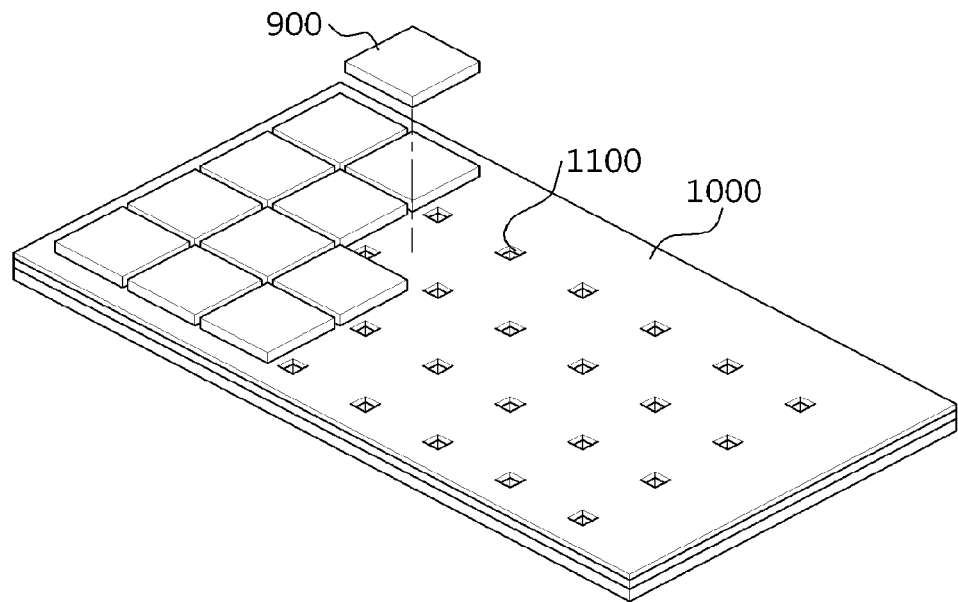
FIG. 20A is a diagram illustrating an example of bonding LED chips and a film type phosphor pre-form provided in a sheet form according to an embodiment of the present invention and FIG. 20B is a top view illustrating dividing of LED chips bonded in FIG. 20A.
Figure 20B:
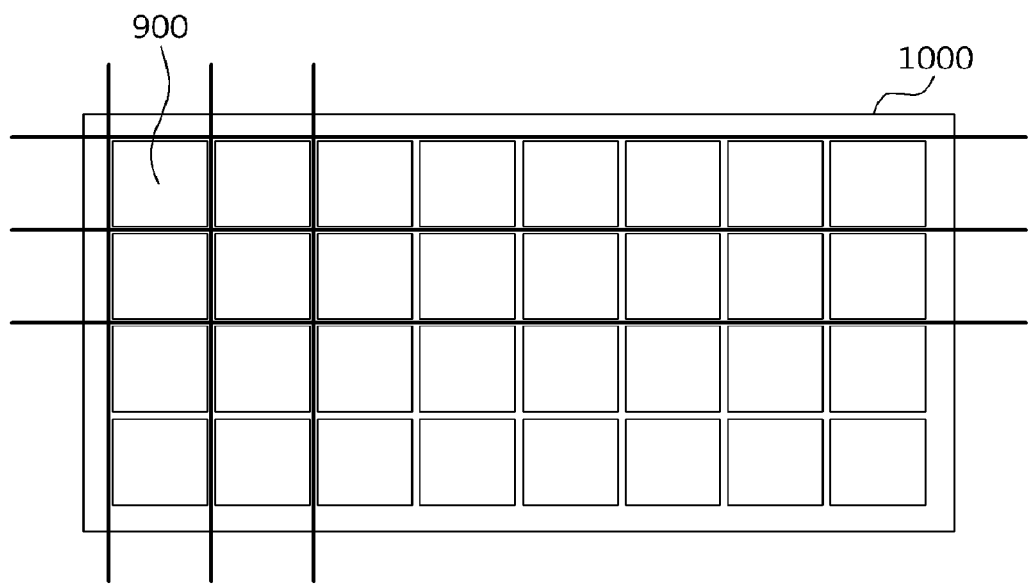

FIG. 20A illustrates an example of bonding the LED chips 900 and a film type phosphor pre-form provided in a sheet form according to example embodiments. FIG. 20B is a top view illustrating individual divided LED chips 900 bonded in FIG. 20A according to example embodiments.

Referring to FIG. 20A and 20B, the film type phosphor pre-form 1000 may be provided in a sheet form. The patterned holes 1100 may be formed on the film-type phosphor pre-form 1000 provided in the sheet form, to arrange the LED chips 900.

The LED chips 900 are arranged between patterned holes 1100 that are spaced away from each other, the LED chips 900 and the film type phosphor pre-form 1000 are bonded, and the film type phosphor pre-form 1000 provided in the sheet form may be divided based on the LED chips 900 as shown in FIG. 20A. The patterned hole 1100 may function as a guide line for dividing the film type phosphor pre-form 1000 into the LED chips 900.

A phosphor layer forming apparatus that forms a phosphor layer in an LED chip may simultaneously bond a film type phosphor pre-form provided in the sheet form and a plurality of LED chips, and may divide the film type phosphor pre-form.

Figure 21:
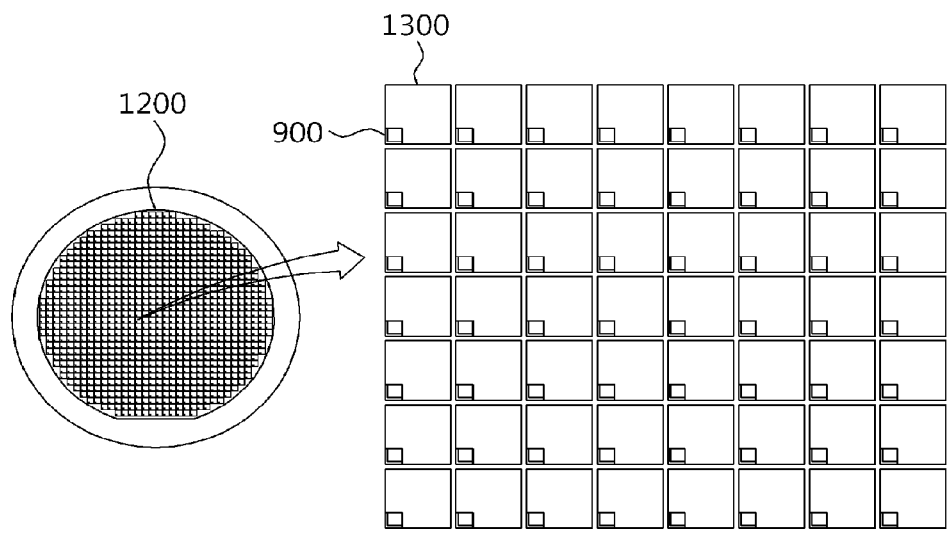
FIG. 21 is a diagram illustrating an example of bonding an LED chip formed on a wafer to a film type phosphor pre-form according to an embodiment of the present invention.

FIG. 21 illustrates an example of bonding the LED chip 900 formed on a wafer 1200 and the film type phosphor pre-form 1300 according to example embodiments.

Referring to FIG. 21, the LED chips 900 formed on the wafer 1200 may be provided. The LED chips 900 and the film type phosphor pre-forms 1300 are bonded, and the wafer 1200 may be divided based on the LED chips 900. The film type phosphor pre-forms 1300 may be bonded to the LED chips 900 formed on the wafer 1200, and may be divided based on the LED chips 900.

Depending on an embodiment of the present invention, a phosphor layer forming apparatus that forms a phosphor layer in an LED chip may simultaneously bond LED chips formed on a wafer to film type phosphor pre-forms and may divide the wafer based on the LED chips.

Depending on an embodiment of the present invention, a phosphor pre-form may be provided in a sheet form and LED chips may be formed on a wafer. The LED chips formed on the wafer may be bonded to the phosphor pre-form in the sheet form, and the phosphor preformed in the sheet form and the wafer may be divided based on an LED chip unit.

Depending on an embodiment of the present invention, the phosphor layer forming apparatus may simultaneously bond a film type phosphor pre-form in a sheet form to LED chips formed on a wafer, and may divide the film type phosphor pre-form and the wafer.

Figure 22:
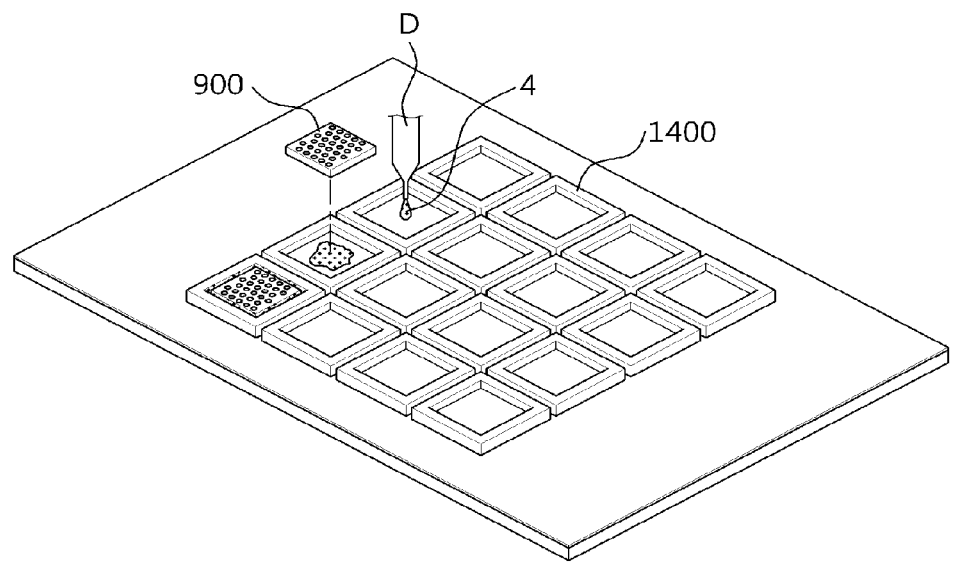
FIG. 22 is a diagram illustrating an example of bonding a cavity type phosphor pre-form to an LED chip according to an embodiment of the present invention.

A phosphor layer forming method according to other example embodiments may include preparing at least one LED chip having the same optical property, preparing a phosphor pre-form that corresponds to the at least one LED chip and that includes a cavity formed in a central area, and bonding the phosphor pre-form to the at least one LED chip. FIG. 22 illustrates an example of bonding a cavity type phosphor pre-form 1400 and the LED chip 900 according to example embodiments.

Referring to FIG. 22, cavity type phosphor pre-forms 1400 are separately arranged. The cavity type phosphor pre-form 1400 may have a cavity that is formed in a central area of the cavity type phosphor pre-form 1400 and that is thinner than a thickness of the phosphor pre-form and thus, the LED chip 900 may be included in the cavity. Accordingly, a phosphor layer may be formed on a side and a top side of the LED chip 900, and light emitted from the LED chip 900 may be all converted into a white light. A dispenser (D) may spray liquid adhesive 4 into the cavity of the cavity type phosphor pre-form 1400 so that the LED chip 900 may be attached to the cavity type phosphor pre-form 1400. The LED chip 900 may be individually bonded to the cavity type phosphor pre-forms 1400 as illustrated in FIG. 19.

The LED chips 900 may be separately arranged. In this example, the cavity type phosphor pre-forms 1400 may be individually bonded to the LED chip 900, on a top side of the LED chip 900.

Depending on embodiments of the present invention, a phosphor layer forming apparatus that forms a phosphor layer in an LED chip may simultaneously bond a plurality of cavity type phosphor pre-forms and a plurality of LED chips.

When an LED chip and a cavity type phosphor pre-form are prepared, the LED chip and the cavity phosphor pre-form may be individually bonded. A plurality of LED chips and a plurality of film type phosphor pre-forms may be simultaneously bonded. When LED chips formed on a wafer are provided and a film type phosphor pre-form is provided in a sheet form, the LED chips and the phosphor pre-form may be simultaneously bonded. In this example, the LED chip and the cavity type phosphor pre-form may be arranged to correspond to each other before being bonded.

Furthermore, a cavity type phosphor pre-form may be provided, similar to the film type phosphor pre-form 100 of FIG. 3A, in a sheet form including a plurality of cavities that correspond to LED chips. In this example, the LED chips may be bonded to the cavity type phosphor pre-form in the sheet form, and the cavity type phosphor pre-form may be divided based on the LED chips.

Depending on embodiments of the present invention, LED chips formed on a wafer may be provided similar to FIG. 21. In this example, cavity type phosphor pre-forms and the LED chips are bonded, and the wafer may be divided based on an LED chip unit to which a phosphor layer is attached.

Depending on embodiments of the present invention, a cavity type phosphor pre-form may be provided in a sheet form including a plurality of cavities corresponding to LED chips, and the LED chips may be formed on a wafer. The cavity type phosphor pre-form provided in the sheet form and the LED chips formed on the wafer may be bonded, and the cavity type phosphor pre-form in the sheet form and the wafer may be divided based on an LED chip unit.

Depending on embodiments of the present invention, the phosphor layer forming apparatus may simultaneously bond a cavity type phosphor pre-form in the sheet form and LED chips, and may divide the cavity type phosphor pre-form and the wafer.

Figure 23A:
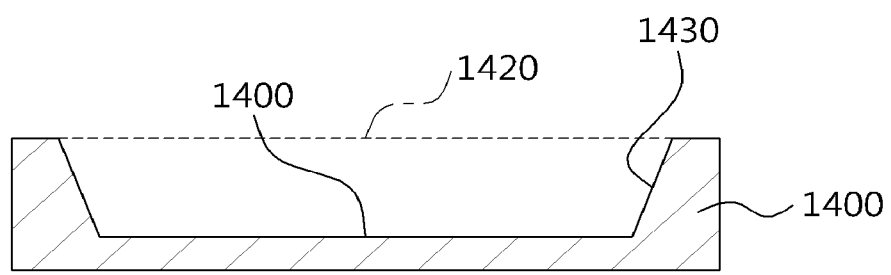
FIG. 23A is a diagram illustrating a structure of a cavity type phosphor pre-form according to an embodiment of the present invention and FIG. 23B is a diagram illustrating an LED chip mounted on the cavity type phosphor pre-form of FIG. 23A.
Figure 23B:
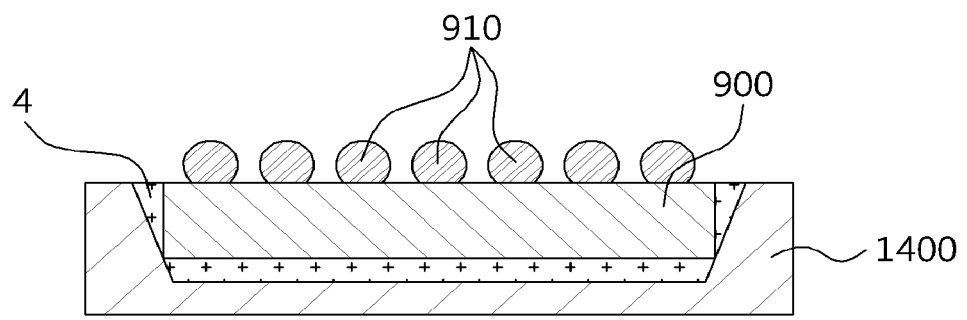

FIG. 23A illustrates a structure of the cavity type phosphor pre-form 1400 according to example embodiments. FIG. 23B illustrates the LED chip 900 mounted on the cavity type phosphor pre-form 1400 of FIG. 23A.

Referring to FIGS. 23A and 23B, in the cavity type phosphor pre-form 1400, an inclined side 1430 of a cavity may be formed to enable a bottom side 1410 of the cavity to be smaller than a top side 1420 of the cavity. The LED chip 900 that is included in the cavity may be automatically arranged in a center of the cavity, due to the inclined side 1430.

An interval between the LED chip 900 and the cavity type phosphor pre-form 1400 may be controlled by adjusting an angle of inclination and a size of an inside of the cavity. The LED chip 900 may be attached to the cavity of the cavity type phosphor pre-form 1400 using an adhesive 4. Subsequently, the LED chip 900 including a phosphor layer may be mounted on a substrate using a bump 910.

A phosphor layer forming method according to example embodiments may form, in an LED chip level, a phosphor layer by bonding a phosphor pre-form, and a packaging process may be selectively performed to an LED chip to be used for providing a white light. Thus, a yield of an LED package may be maximized.

A phosphor layer forming apparatus according to example embodiments may simultaneously bond a plurality of phosphor pre-forms to LED chips that are arranged for each group through a binning process to provide a white light and thus, may decrease color dispersion and improve productivity.

Even though an LED chip including a phosphor layer formed by the phosphor layer forming method according to example embodiments may be mounted on a substrate based on following methods, the mounting may not be limited thereto.

Figure 24A:
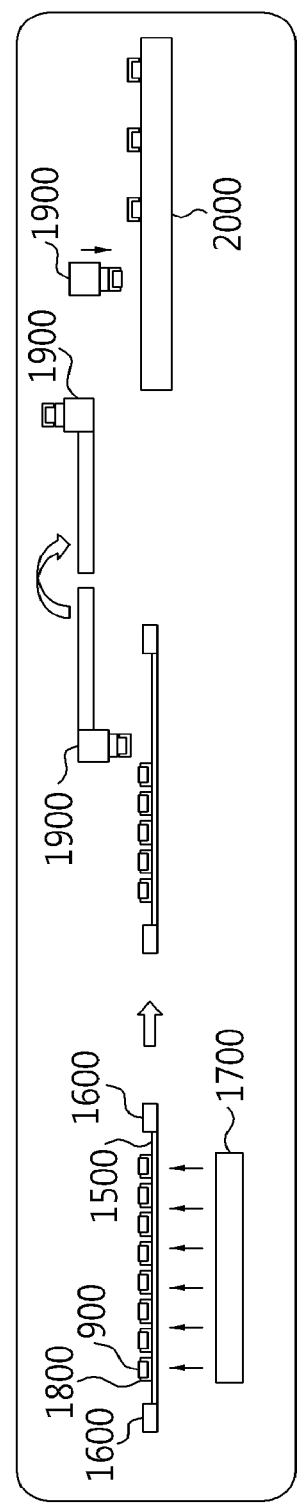
FIGS. 24A through 24C are diagrams illustrating a method of mounting an LED chip including a phosphor layer on a substrate.
Figure 24B:
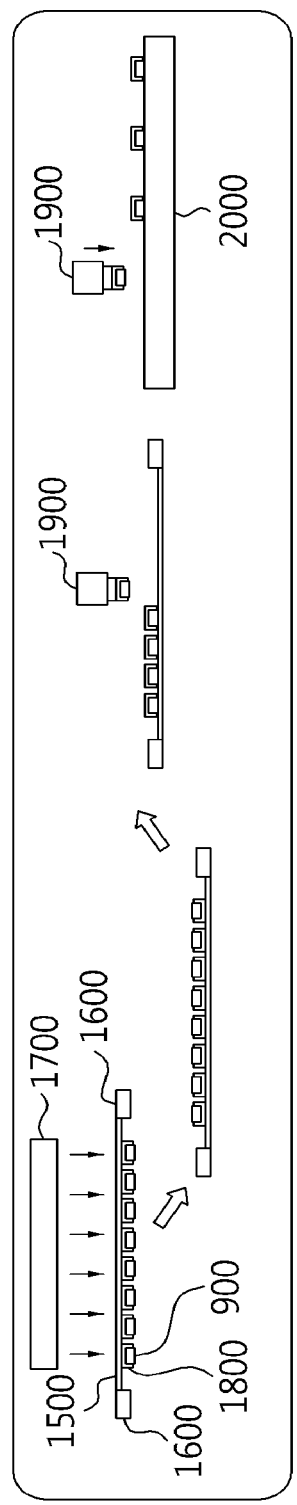
Figure 24C:
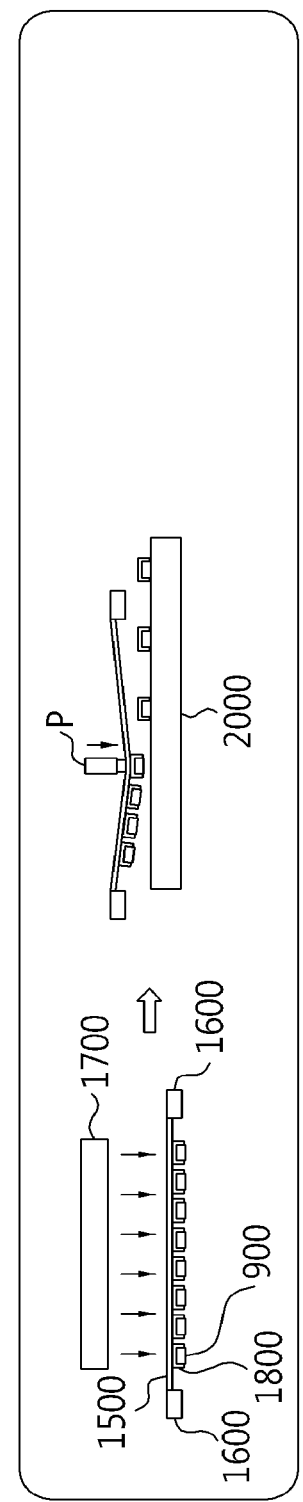

FIGS. 24A through 24C illustrate a method of mounting the LED chip 900 including the phosphor layer 1800 on a substrate 2000.

Referring to FIGS. 24A through 24C, the LED chip 900 including the phosphor layer 1800 may be placed on a carrier tape 1500, and metal frames 1600 are arranged on both sides of the carrier tape 1500.

Referring to FIG. 24A, an ultraviolet irradiator 1700 arranged in a bottom of the carrier tape 1500 may emit an ultraviolet ray to decrease adhesion between the carrier tape 1500 and the phosphor layer 1800. Subsequently, a pick-up device 1900 may lift the LED chip 900 and rotate the LED chip 900 by about 180 degrees to enable the phosphor layer 1800 to face a top side. The LED chip 900 may be mounted on the substrate 2000 using another pick-up device 1900.

Referring to FIG. 24B, the ultraviolet irradiator 1700 arranged in the top of the carrier tape 1500 may emit an ultraviolet ray to decrease adhesion between the carrier tape 1500 and the phosphor layer 1800. Subsequently, a transfer process may be performed so that the LED chip 900 is attached to another carrier tape. The pick-up device 100 may lift the LED chip 900 including the phosphor layer 1800 and mount the LED chip 900 on the substrate 2000.

Referring to FIG. 24C, the ultraviolet irradiator 1700 arranged on the top of the carrier tape 1500 may emit an ultraviolet ray to decrease adhesion between the carrier tape 1500 and the phosphor layer 1800. Subsequently, a pushpress device may press the LED chip 900 from the top of the carrier tape 1500 so that the LED chip 900 may be directly mounted on the substrate 2000.

A phosphor layer forming method according to other example embodiments will be described here. In a phosphor layer forming apparatus, according to example embodiments, a phosphor pre-form may be a film type phosphor pre-form including a phosphor layer and an adhesive layer, and may be a cavity type phosphor pre-form including a cavity formed in a central area.

A phosphor layer forming apparatus using a cavity phosphor pre-form will be described. A phosphor layer forming apparatus using a film type phosphor pre-form may be operated in the same manner, and a dispenser that sprays an adhesive may be omitted. A location of an LED chip and a location of a phosphor pre-form may be exchanged. The LED chip may be arranged on a second carrier tape and the phosphor pre-form may be arranged on a first carrier tape.

Figure 25A:
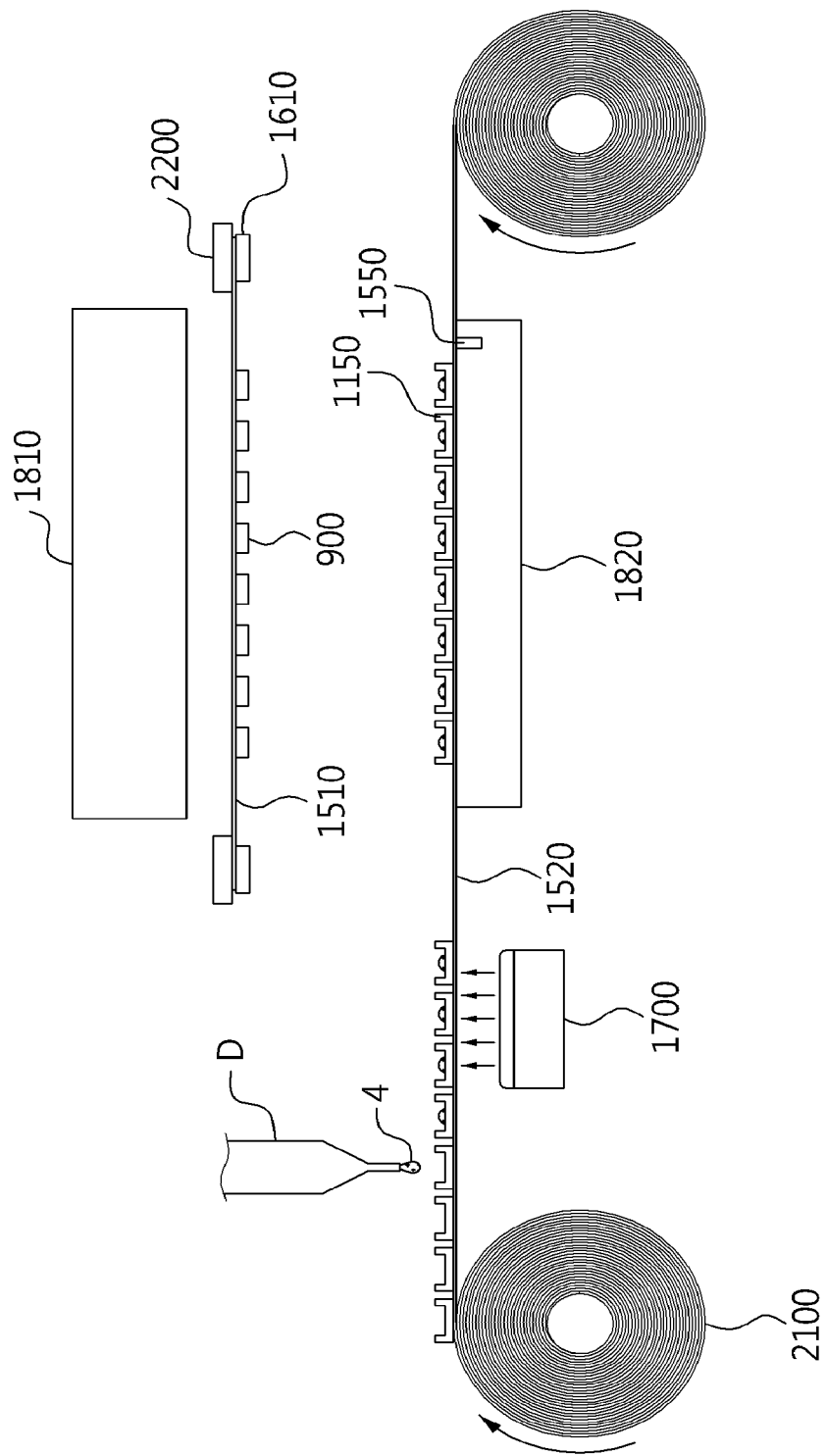
FIGS. 25A and 25B are diagrams illustrating a phosphor layer forming apparatus that forms a phosphor layer in an LED according to an embodiment of the present invention and FIG. 25C is a diagram illustrating a phosphor layer that is bonded to an LED chip using a phosphor layer forming apparatus according to an embodiment of the present invention.
Figure 25B:
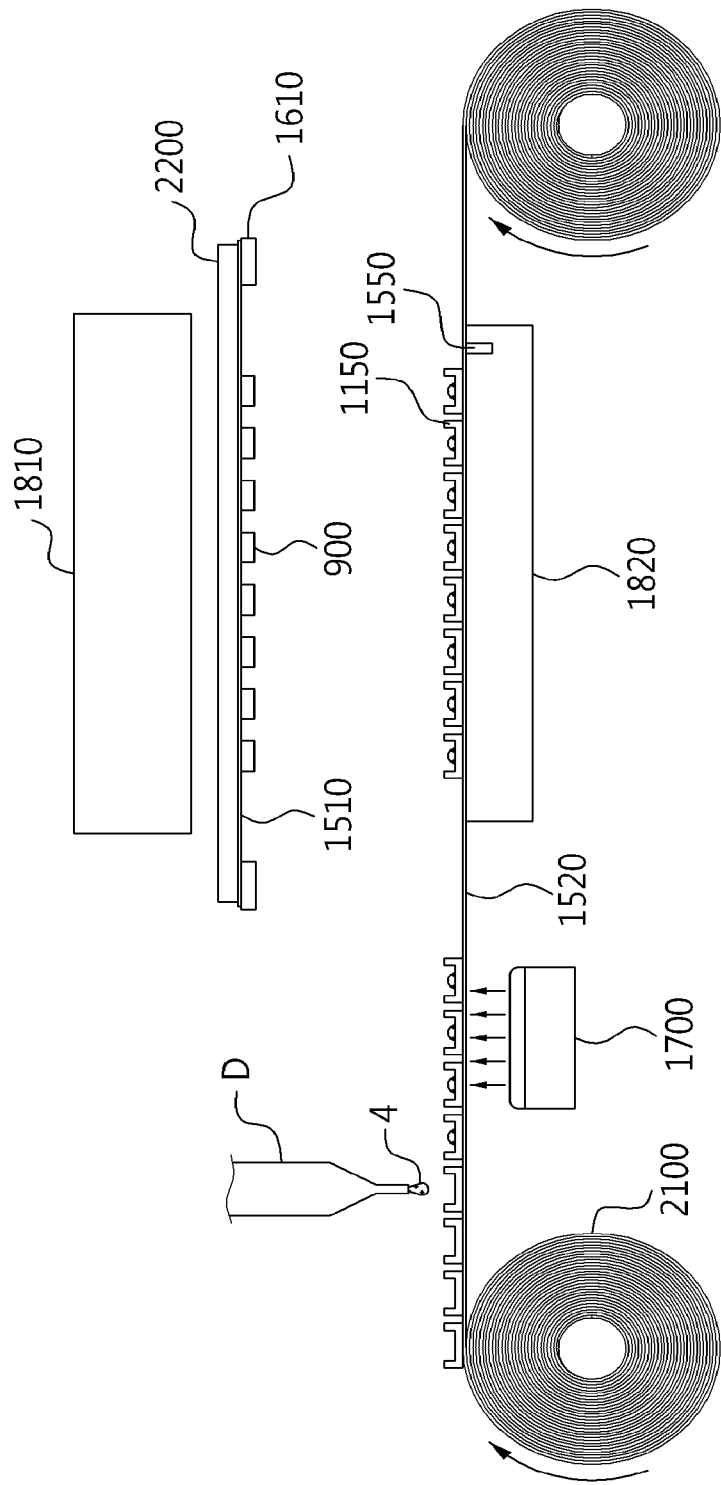
Figure 25C:
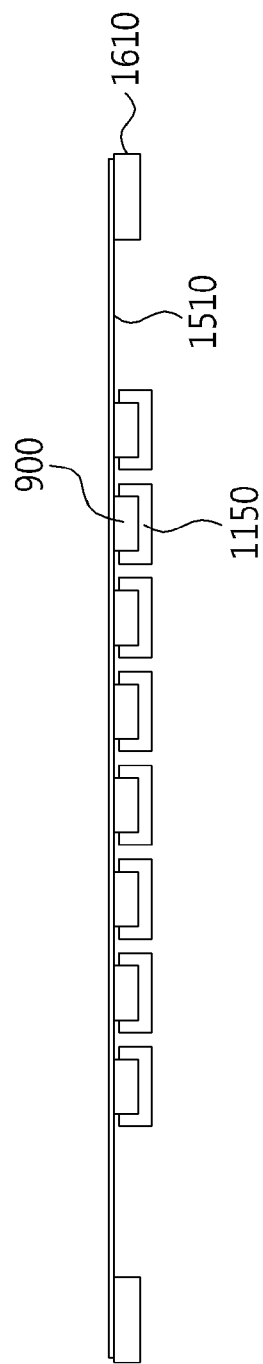

FIGS. 25A and 25B illustrate a phosphor layer forming apparatus for forming a phosphor layer in an LED according to example embodiments. FIG. 25C illustrates a phosphor layer bonded to an LED chip using the phosphor layer forming apparatus according to example embodiments.

Referring to FIGS. 25A through 25C, the phosphor layer forming apparatus may include a first carrier tape 1510, a second carrier tape 1520, a sensor 1550, an arranging unit 2200, a first metal frame 1610, an upper press 1810, a lower press 1820, and a roller 2100.

The first carrier tape 1510 may transfer at least one LED chip 900 having the same optical property. The second carrier tape 1520 may transfer the cavity type phosphor pre-form 1150 that is attached to the LED chip 900. The second carrier tape 1520 may transfer the cavity type phosphor pre-form 1150 using the roller 2100. The cavity type phosphor pre-form 1150 may be provided by the second carrier tape 1520 in a state of being arranged. The sensor 1550 may recognize a location of the second carrier tape 1520, and the transferred phosphor pre-form 1150 may be held by the sensor 1550.

The arranging unit 2200 may arrange the LED chip 900 to correspond to the arranged phosphor pre-form 1150. The first metal frame 1610 may be arranged at the bottom side of the arranging unit 2200 to assist arranging of the LED chip 900 transferred by the first carrier tape 1510.

Referring to FIG. 25B, the arranging unit 2200 may stick to the whole first carrier tape 1510 to arrange the LED chip 900. When the arranging unit 2200 sticks to the whole first carrier tape 1510, a change in a location of the LED chip 900 on the first carrier tape 1510 may be minimized and thus, accuracy in the arrangement may be improved.

While the arranging unit 2200 holds the first metal frame 1610, and the arranging unit 2200 may arrange the LED chip 900 transferred by the first carrier tape 1510 to correspond to the cavity type phosphor pre-form 1150 based on information of a vision device (not illustrated) between the LED chip 900 and the cavity type phosphor pre-form 1150. In this example, the arranging unit 2200 may hold the first metal frame 1610 using vacuum or magnetism.

When the LED chip 900 corresponds to the cavity type phosphor pre-form 1150, the arranging unit 2200 may move down. When the LED chip 900 and the cavity type phosphor pre-form 1150 are close, the arranging unit 2200 may move slowly so that the LED chip 900 and the cavity type phosphor pre-form 1150 smoothly contact each other.

The upper press 1810 may lower the first carrier tape 1510 and the lower press 1820 may raise the second carrier tape 1520 so that the LED chip 900 and the cavity type phosphor pre-form 1150 are bonded.

The upper press 1810 and the lower press 1820 may further include a heating unit to apply heat to be used for hardening adhesive during the bonding of the LED chip 900 and the cavity type phosphor pre-form 1150. The heating unit may be formed to be integrated with the upper press 1810 and with the lower press 1820.

A dispenser (D) that sprays an adhesive 45 into the transferred cavity type phosphor pre-form 150 may be included, to bond the cavity type phosphor pre-form 1150 and the LED chip 900. The ultraviolet irradiator 1700 may be arranged at a bottom side of the second carrier tape 1520 to readily separate the cavity type phosphor pre-form 1150 from the second carrier tape 1520, after the cavity type phosphor pre-form 1150 is bonded to the LED chip 900.

Figure 26A:
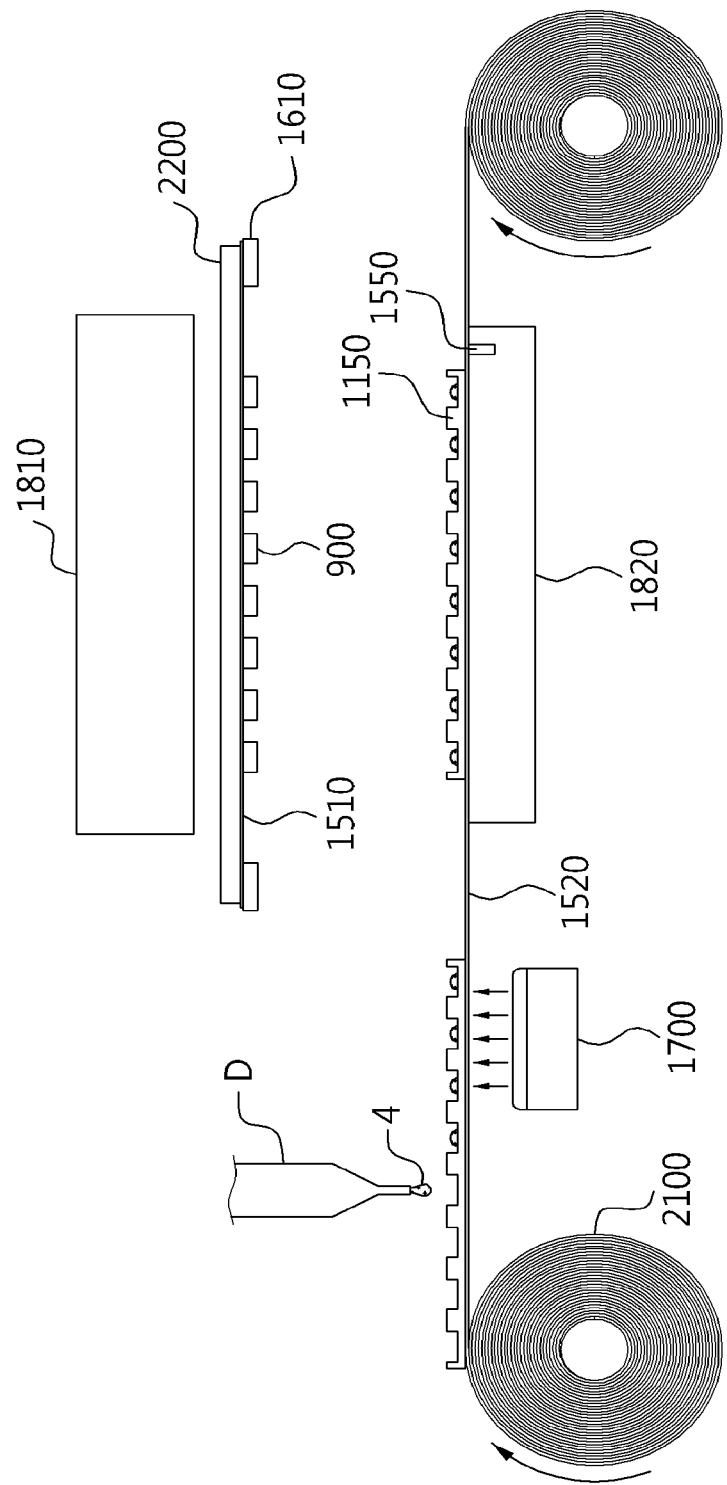
FIG. 26A is a diagram illustrating that a phosphor pre-form is provided in a sheet form in a phosphor layer forming apparatus that forms a phosphor layer in an LED according to an embodiment of the present invention.
Figure 26B:
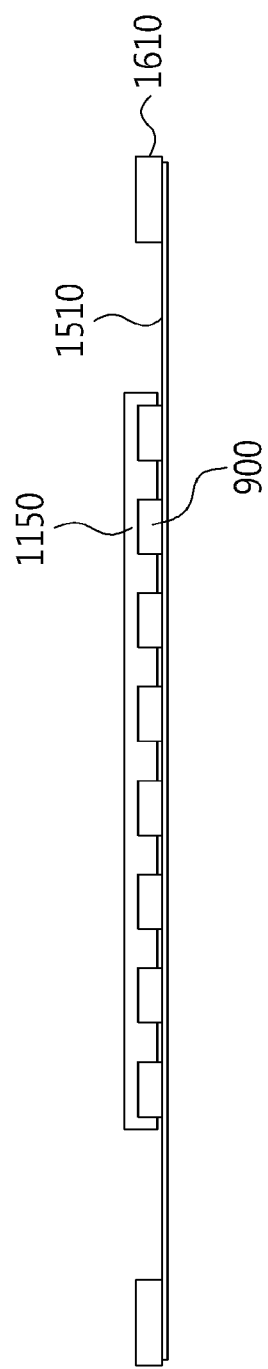
FIG. 26B is a diagram illustrating the phosphor layer that is bonded to the LED chip in FIG. 26A according to an embodiment of the present invention.
Figure 26C:
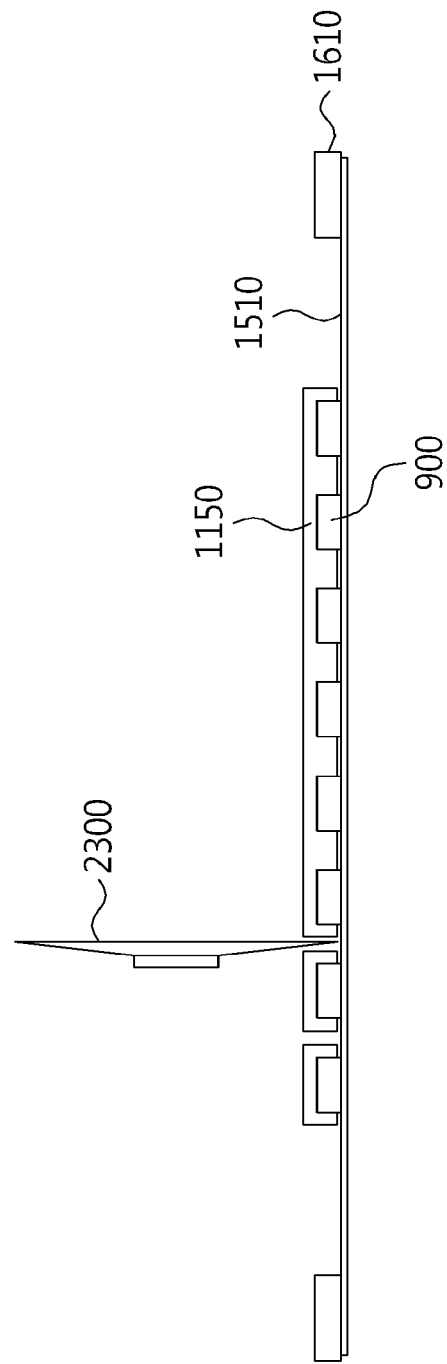
FIG. 26C is a diagram illustrating an example of dividing the LED chips of FIG. 26B based on an LED chip unit according to an embodiment of the present invention.

FIG. 26A illustrates that the cavity type phosphor pre-form 1150 is provided in a sheet form in a phosphor layer forming apparatus that forms a phosphor layer in an LED chip according to example embodiments. FIG. 26B illustrates the phosphor layer that is bonded to the LED chip in FIG. 26A according to example embodiments. FIG. 26C illustrates an example of dividing the LED chips of FIG. 26B based on an LED chip unit according to example embodiments.

Referring to FIGS. 26A through 26C, the phosphor layer forming apparatus according to example embodiments may be the same as the phosphor layer forming apparatus of FIG. 25B, and the cavity type phosphor pre-form 1150 transferred by the second carrier tape 1520 may be provided in a sheet form. The cavity type phosphor pre-form 1150 may be provided in a sheet form including a plurality of cavities corresponding to the LED chips 900. The cavity type phosphor pre-form 1150 provided in the sheet form and the LED chips 900 are bonded, and the cavity type phosphor pre-form 1150 may be divided, by a dividing unit 2300, based on the LED chip unit.

Figure 27:
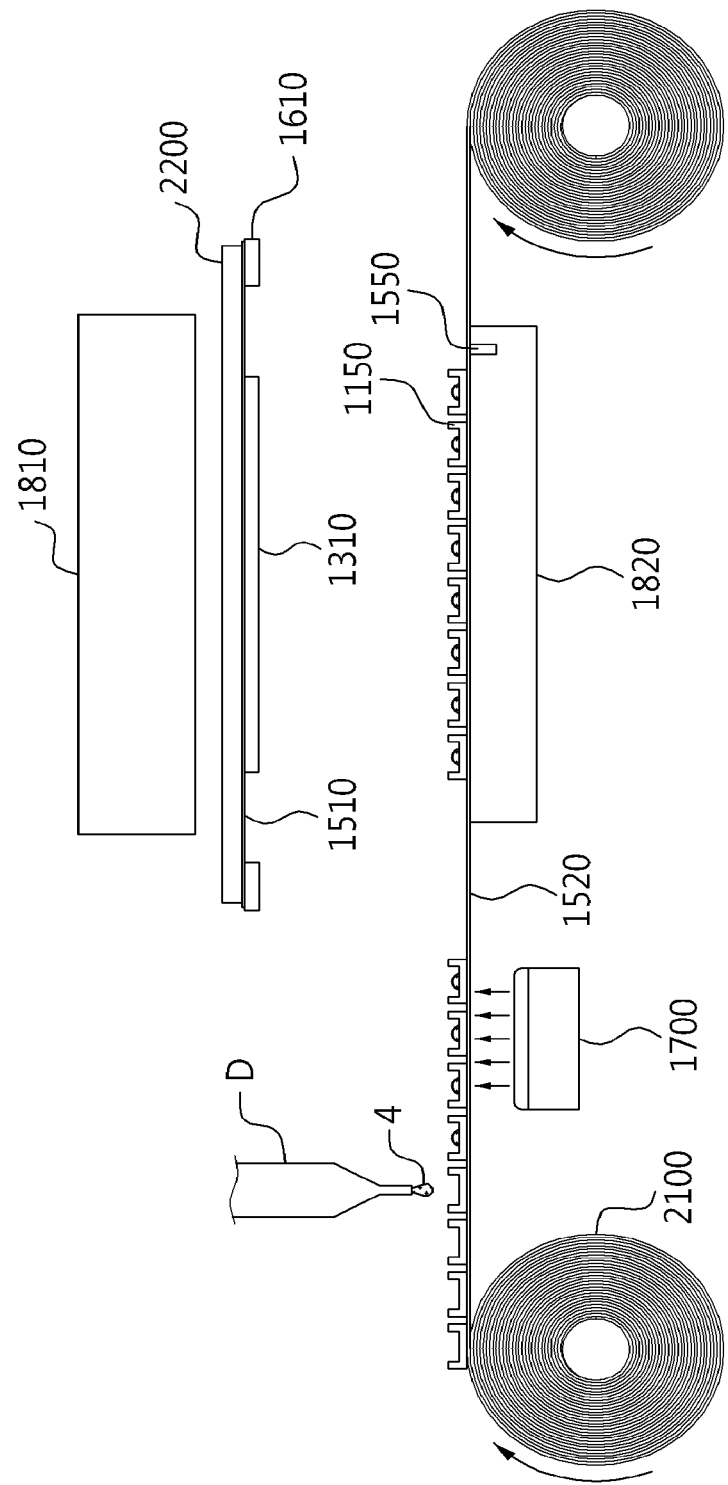
FIG. 27 is a diagram illustrating that LED chips formed on a wafer is provided in a phosphor layer forming apparatus that forms a phosphor layer in an LED according to an embodiment of the present invention and FIG. 28 is a diagram illustrating that a phosphor pre-form is provided in a sheet form and LED chips are provided being formed on a wafer, in a phosphor layer forming apparatus that forms a phosphor layer in an LED according to an embodiment of the present invention.

FIG. 27 illustrates that LED chips formed on the wafer 1310 are provided in a phosphor layer forming apparatus that forms a phosphor layer in an LED chip 900 according to example embodiments.

Referring to FIG. 27, the LED chips 900 formed on the wafer 1310 may be provided. The cavity type phosphor pre-forms 1150 and the LED chips 900 may be bonded, and the LED chips 900 may be separated by dividing the wafer 1310 based on an LED chip unit including a phosphor layer.

Figure 28:
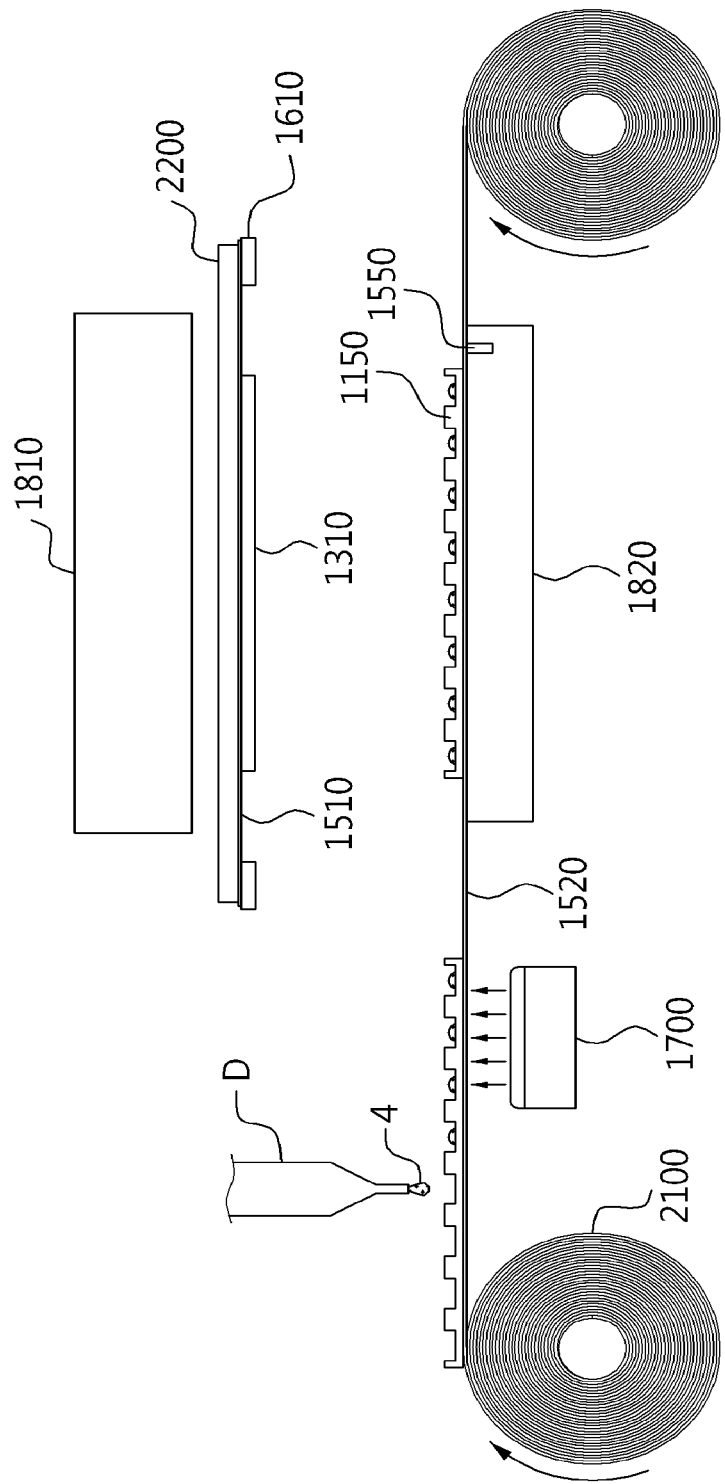

FIG. 28 illustrates that a phosphor pre-form in a sheet form and LED chips 900 formed on a wafer are provided in a phosphor layer forming apparatus that forms a phosphor layer in an LED chip 900 according to example embodiments.

Referring to FIG. 28, the cavity type phosphor pre-form 1150 may be provided in the sheet form including a plurality of cavities corresponding to the LED chips 900, and the LED chips 900 may be formed on the wafer 1310. The cavity type phosphor pre-form 1150 in the sheet form may be bonded to the LED chips 900 formed on the wafer 1310, and the cavity type phosphor pre-form 1150 and the wafer 1310 may be divided based on an LED chip unit.

Figure 29A:
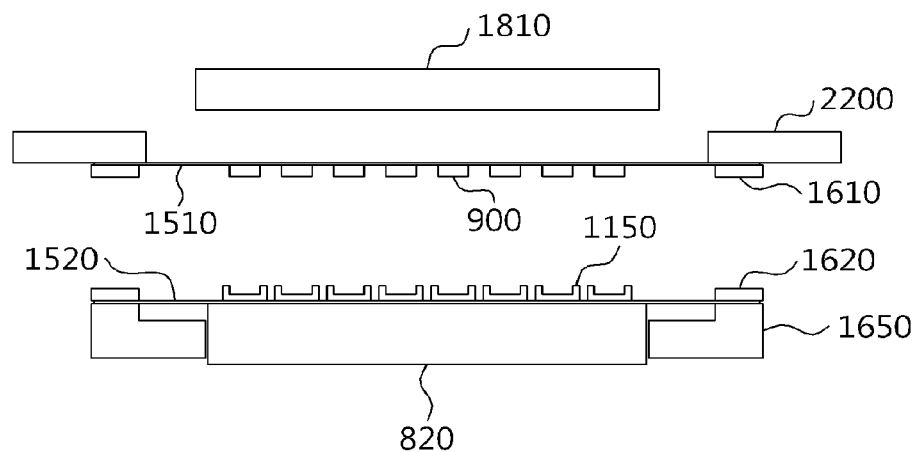
FIG. 29A is a diagram illustrating a phosphor layer forming apparatus for forming a phosphor layer in an LED according to other an embodiment of the present invention.
Figure 29B:
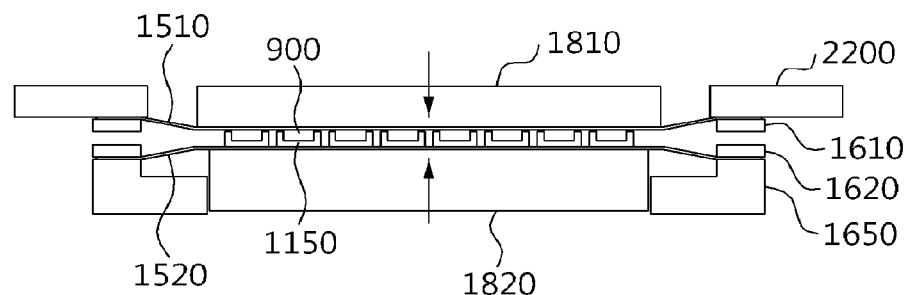
FIG. 29B is a diagram illustrating that an LED chip and a phosphor pre-form are bonded by moving an upper press and a lower press in FIG. 29A.
Figure 29C:
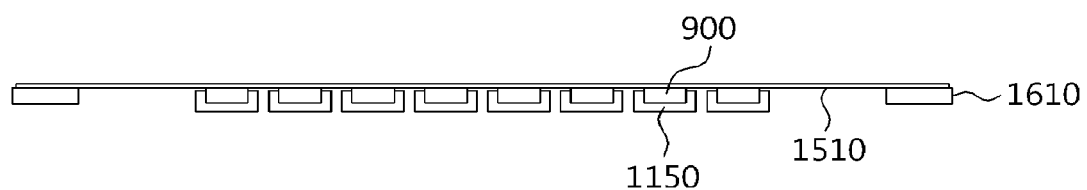
FIG. 29C is a diagram separately illustrating the phosphor layer bonded to the LED chip in FIG. 29B.

FIG. 29A illustrates a phosphor layer forming apparatus for forming a phosphor layer in an LED according to other example embodiments. FIG. 29B illustrates that the LED chip 900 and the cavity type phosphor pre-form 1150 are bonded by moving an upper press and a lower press of FIG. 29A. FIG. 29C separately illustrates the phosphor layer and the LED chip 900 that are bonded in FIG. 29B.

Referring to FIGS. 29A through 29C, a phosphor layer forming apparatus according to example embodiments may further include the first metal frame 1610 and the second metal frame 1620. The second metal frame 1620 may be placed on a holder 650 that is spaced away from the lower press 1820, and may assist arranging of the cavity type phosphor pre-form 1150. The metal frame holder 650 may hold the second metal frame 1620, and the second metal frame 1620 may hold the cavity type phosphor pre-form 1150 in an arranged state.

After the LED chip 900 may be arranged to correspond to the cavity type phosphor pre-form 1150, the upper press 1810 may lower the first carrier tape 1510 and the lower press 1820 may raise the second carrier tape 1520 so that the LED chip 900 and the cavity type phosphor pre-form 1150 may be bonded.

Figure 30A:
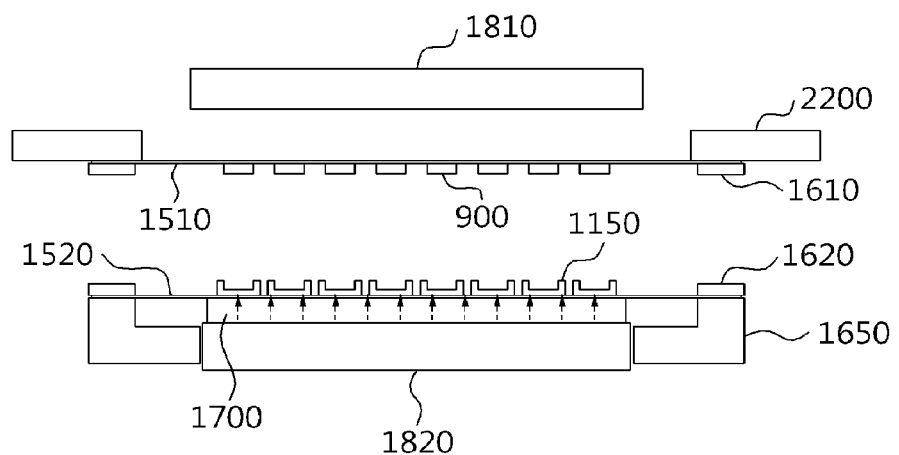
FIG. 30A is a diagram illustrating a phosphor layer forming apparatus for forming a phosphor layer in an LED according to still other an embodiment of the present invention.
Figure 30B:
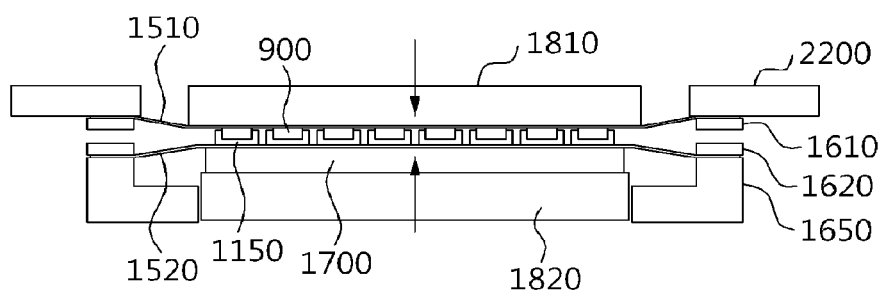
FIG. 30B is a diagram illustrating that an LED chip and a phosphor pre-form are bonded by moving an upper press and a lower press of FIG. 30A.
Figure 30C:
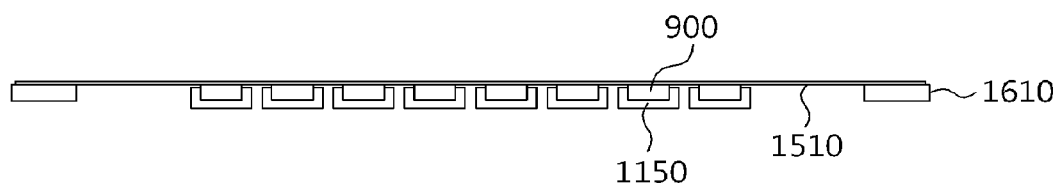
FIG. 30C is a diagram separately illustrating the phosphor layer bonded to the LED chip in FIG. 30B.
Figure 31A:
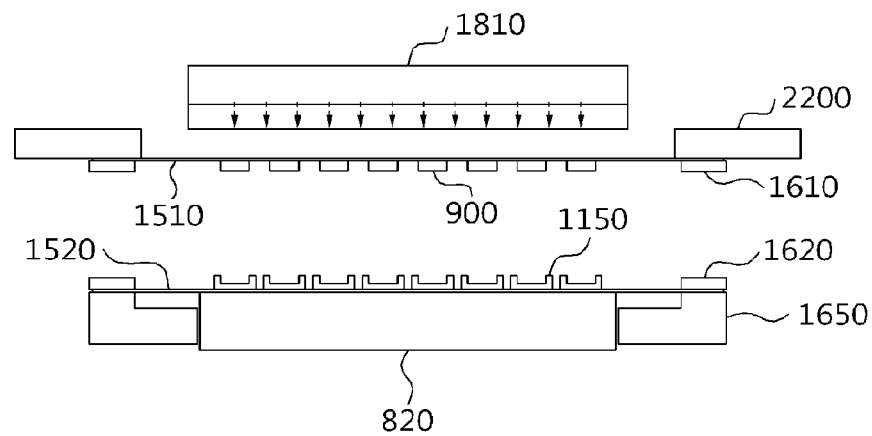
FIG. 31A is a diagram illustrating a phosphor layer forming apparatus for forming a phosphor layer in an LED according to yet other an embodiment of the present invention.
Figure 31B:
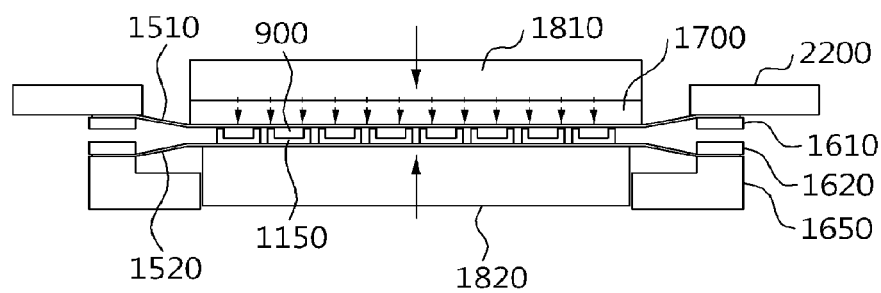
FIG. 31B is a diagram illustrating that an LED chip and a phosphor pre-form are bonded by moving an upper press and a lower press of FIG. 31A.
Figure 31C:
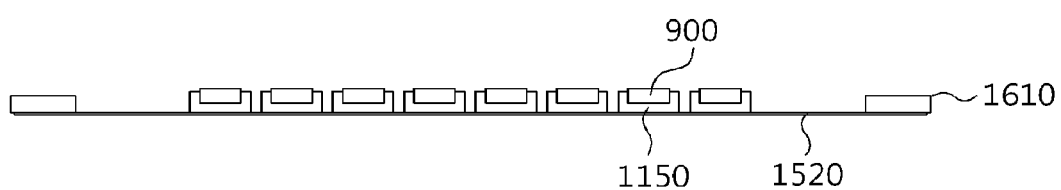
FIG. 31C is a diagram separately illustrating the phosphor layer bonded to the LED chip in FIG. 31B.

FIG. 30A illustrates a phosphor layer forming apparatus for forming a phosphor layer in an LED according to still other example embodiments. FIG. 30B illustrates that the LED chip 900 and the cavity type phosphor pre-form 1150 are bonded by moving an upper press and a lower press of FIG. 30A. FIG. 30C separately illustrates the phosphor layer and the LED chip 900 that are bonded in FIG. 30B.

Referring to FIGS. 30A through 30C, a phosphor layer forming apparatus according to example embodiments may further include the ultraviolet irradiator 1700 in the lower press 1820. The ultraviolet irradiator 1700 may be integrally formed with the lower press 1820. The ultraviolet irradiator 1700 may be included to separate the cavity type phosphor pre-form 1150 from the second carrier tape 1520 after the LED chip 900 and the cavity type phosphor pre-form are bonded. Therefore, the ultraviolet irradiator 1700 may be integrally formed with the lower press 1820 to readily separate the cavity type phosphor pre-form 1150 from the second carrier tape 1520 and thus, a process may be simplified.

A phosphor layer forming apparatus according to example embodiments may simultaneously bond a plurality of phosphor pre-forms to LED chips that are arranged for each group through a binning process to provide a white light and thus, may increase accuracy or precision of bonding between the LED chip and the phosphor pre-form. Also, productivity may be increased since a process is simplified.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A manufacturing method of a light emitting diode (LED), comprising:
    manufacturing a plurality of LED chips which are separated from one another;
    manufacturing a phosphor pre-form comprising a plurality of mounting areas for mounting the plurality of LED chips and a plurality of protruding areas for dividing the plurality of mounting areas;
    mounting each of the plurality of LED chips in a corresponding one of the plurality of mounting areas; and
    cutting the phosphor pre-form in the plurality of protruding areas for dividing the plurality of mounting areas, into units including individual LED chips,
    wherein sidewalls of each of the plurality of LED chips are in contact with the corresponding mounting area.

2. The manufacturing method of claim 1, wherein the mounting of each of the plurality of LED chips in a corresponding one of the plurality of mounting areas comprises:
    bonding a light emission surface of each of the plurality of LED chips having a flip chip structure in the corresponding mounting area.

3. The manufacturing method of claim 1, wherein the manufacturing of the plurality of LED chips comprises:
    forming a first bump having a first size on at least one electrode disposed on one surface of each of the plurality of LED chips.

4. The manufacturing method of claim 3, wherein the manufacturing of the phosphor pre-form comprises:
    forming a bump receiving portion in a position corresponding to the first bump on a bottom surface of each of the plurality of mounting areas.

5. The manufacturing method of claim 4, wherein the mounting of each of the plurality of LED chips in a corresponding one of the plurality of mounting areas is performed such that the first bump is received in the bump receiving portion.

6. The manufacturing method of claim 5, further comprising:
    polishing the phosphor pre-form such that the bump receiving portion is opened after the mounting of each of the plurality of LED chips in the corresponding mounting area.

7. The manufacturing method of claim 6, further comprising:
    forming a second bump on the first bump exposed through the bump receiving portion at an outer portion of the phosphor pre-form, the second bump having a second size greater than the first size and a width greater than a width of the bump receiving portion.

8. The manufacturing method of claim 1, wherein the manufacturing of the phosphor pre-form comprises:
    manufacturing phosphor resin by mixing phosphor particles with transparent resin;
    injecting the phosphor resin in a first mold;
    pressurizing the phosphor resin injected in the first mold by a second mold having a structure corresponding to the phosphor pre-form;
    partially curing the pressurized phosphor resin; and
    removing the first mold and the second mold.

9. A light emitting diode (LED) comprising:
    a phosphor sheet comprising a mounting area and a plurality of supporters protruding from a bottom surface of the mounting area; and
    an LED chip supported by the plurality of supporters such that a light emission surface of the LED chip is bonded to an inside of the mounting area with adhesive filled in the phosphor sheet at a height,
    wherein sidewalls of the LED chip are in contact with the mounting area.

10. The LED of claim 9, wherein the LED chip comprises at least one electrode disposed on the light emission surface and a first bump disposed on the at least one electrode, the first bump having a first size.

11. The LED of claim 10, wherein
    the phosphor sheet comprises a bump receiving portion to receive the first bump, and
    the LED chip further comprises a second bump disposed on the first bump exposed through the bump receiving portion, the second bump having a second size greater than the first size.

12. The LED of claim 9, wherein the plurality of supporters have any one of an axial symmetry structure and a point symmetry structure.

13. A manufacturing method of a light emitting diode (LED) module, the manufacturing method comprising:
    manufacturing a plurality of LED chips which are separated from one another;

manufacturing a phosphor pre-form comprising a plurality of mounting areas for mounting the plurality of LED chips;

mounting each of the plurality of LED chips in a corresponding one of the plurality of mounting areas;

cutting the phosphor pre-form in the plurality of different level areas for dividing the plurality of mounting areas, into units including individual LED chips; and mounting the individual LED chips on a substrate, wherein sidewalls of each of the plurality of LED chips are in contact with the corresponding mounting area.

14. The manufacturing method of claim 13, wherein the mounting of each of the plurality of LED chips in a corresponding one of the plurality of mounting areas comprises:

bonding a light emission surface of each of the plurality of LED chips having a flip chip structure in the corresponding mounting area.

15. The manufacturing method of claim 13, wherein the manufacturing of the plurality of LED chips comprises:

forming a first bump having a first size on at least one electrode disposed on one surface of each of the plurality of LED chips.

16. The manufacturing method of claim 15, wherein the manufacturing of the phosphor pre-form comprises:

forming a bump receiving portion on a bottom surface of each of the plurality of mounting areas in a position corresponding to the first bump.

17. The manufacturing method of claim 16, wherein the mounting of each of the plurality of LED chips in a corresponding one of the plurality of mounting areas comprises:

mounting of each of the plurality of LED chips in the corresponding mounting area such that the first bump is received in the bump receiving portion; and polishing the phosphor pre-form such that the bump receiving portion is opened.

18. The manufacturing method of claim 17, further comprising:

forming a second bump on the first bump exposed through the bump receiving portion at an outer portion of the phosphor pre-form, the second bump having a second size greater than the first size and a width greater than a width of the bump receiving portion.

* * * * *